United States Patent
Ahmed et al.

(10) Patent No.: US 10,439,101 B2
(45) Date of Patent: Oct. 8, 2019

(54) MICRO LIGHT-EMITTING DIODE (LED) ELEMENTS AND DISPLAY

(71) Applicant: Intel Corporation, Santa Clara, CA (US)

(72) Inventors: Khaled Ahmed, Santa Clara, CA (US); Anup Pancholi, Santa Clara, CA (US); Ali Khakifirooz, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/681,247

(22) Filed: Aug. 18, 2017

(65) Prior Publication Data

US 2019/0058085 A1    Feb. 21, 2019

(51) Int. Cl.

| H01L 33/02 | (2010.01) |
| H01L 33/38 | (2010.01) |
| H01L 33/06 | (2010.01) |
| H01L 33/04 | (2010.01) |
| H01L 33/24 | (2010.01) |
| H01L 27/15 | (2006.01) |
| H01L 33/18 | (2010.01) |
| H01L 33/32 | (2010.01) |
| H01L 25/075 | (2006.01) |
| H01L 33/56 | (2010.01) |

(52) U.S. Cl.
CPC ............ *H01L 33/02* (2013.01); *H01L 27/156* (2013.01); *H01L 33/04* (2013.01); *H01L 33/06* (2013.01); *H01L 33/18* (2013.01); *H01L 33/24* (2013.01); *H01L 33/32* (2013.01); *H01L 33/38* (2013.01); *H01L 33/382* (2013.01); *H01L 33/385* (2013.01); *H01L 25/0753* (2013.01); *H01L 33/56* (2013.01)

(58) Field of Classification Search
CPC ......... H01L 33/02; H01L 33/04; H01L 33/06; H01L 27/3211; H01L 27/3206; H01L 33/38; H01L 27/153; H01L 27/156
See application file for complete search history.

(56) References Cited

U.S. PATENT DOCUMENTS

| 6,838,819 | B2 * | 1/2005 | Kim | ................ | H01L 27/329 |
| | | | | | 313/494 |
| 8,937,297 | B2 * | 1/2015 | Gilet | ............... | H01L 33/04 |
| | | | | | 257/12 |
| 9,406,839 | B2 * | 8/2016 | Kim | ................ | H01L 33/06 |
| 9,660,139 | B2 * | 5/2017 | Yoo | .................. | H01L 33/18 |
| 2014/0124732 | A1 * | 5/2014 | Cha | ................. | H01L 33/24 |
| | | | | | 257/13 |
| 2015/0279902 | A1 * | 10/2015 | Von Malm | ....... | H01L 25/0753 |
| | | | | | 257/88 |
| 2017/0018685 | A1 * | 1/2017 | Cho | ................ | H01L 33/007 |

* cited by examiner

*Primary Examiner* — Tuan A Hoang
(74) *Attorney, Agent, or Firm* — Schwabe, Williamson & Wyatt, P.C.

(57) ABSTRACT

Micro light-emitting diode (LED) displays and assembly apparatuses are described. In an example, a pixel element for a micro-light emitting diode (LED) display panel includes a first color nanowire LED, a second color nanowire LED, the second color different than the first color, and a pair of third color nanowire LEDs, the third color different than the first and second colors. A continuous insulating material layer ius laterally surrounding the first color nanowire LED, the second color nanowire LED, and the pair of third color nanowire LEDs.

8 Claims, 20 Drawing Sheets

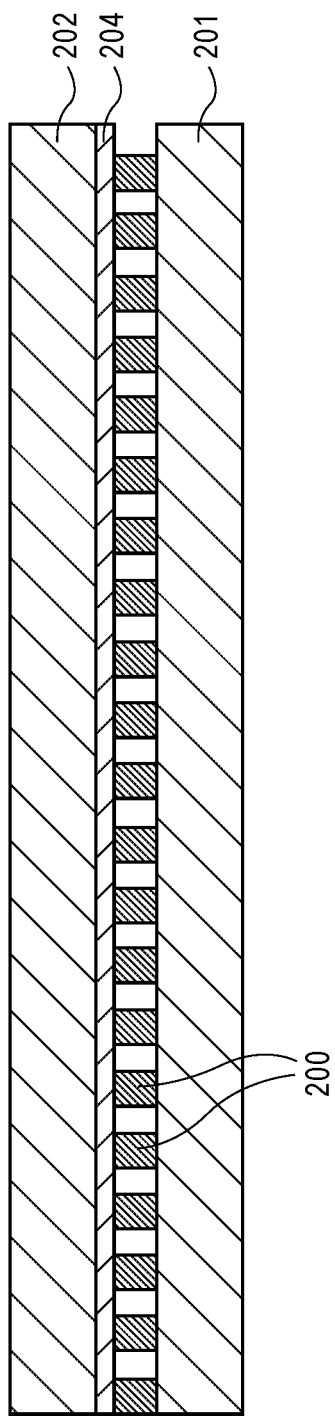
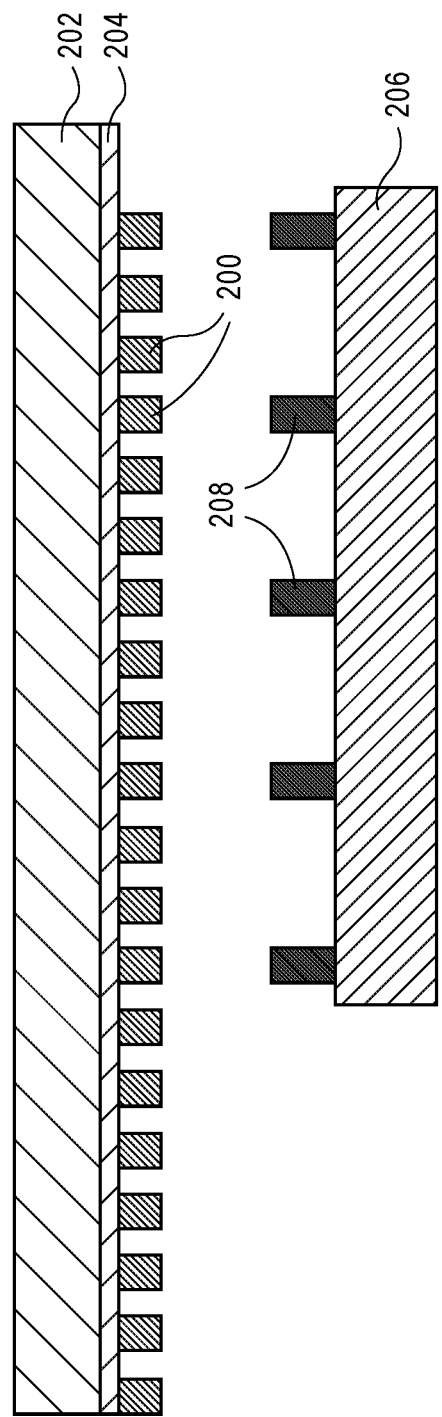
FIG. 2A
FIG. 2B

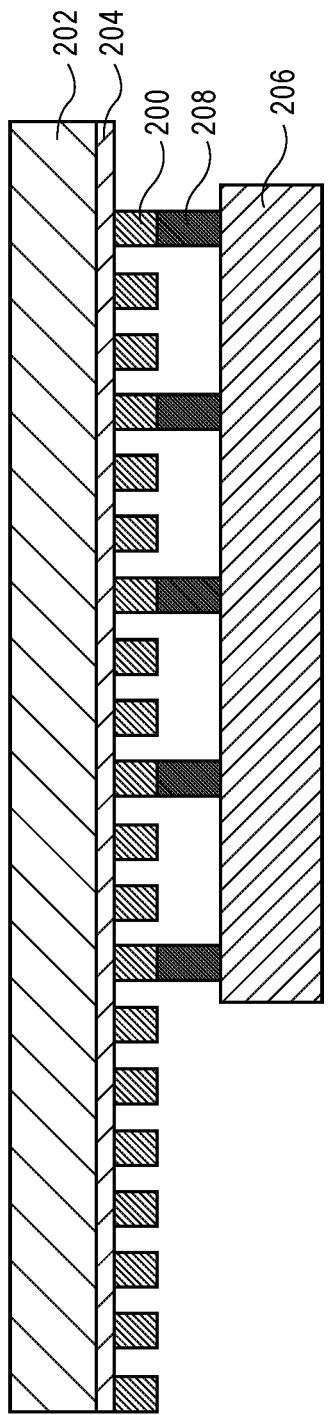
FIG. 2C
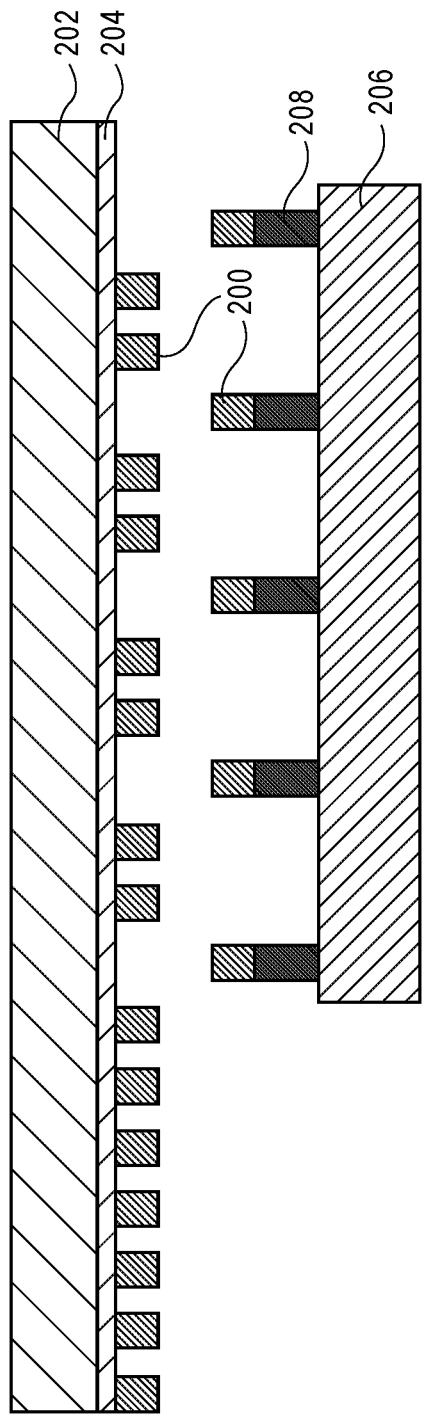
FIG. 2D(1)

FIG. 2D(2)

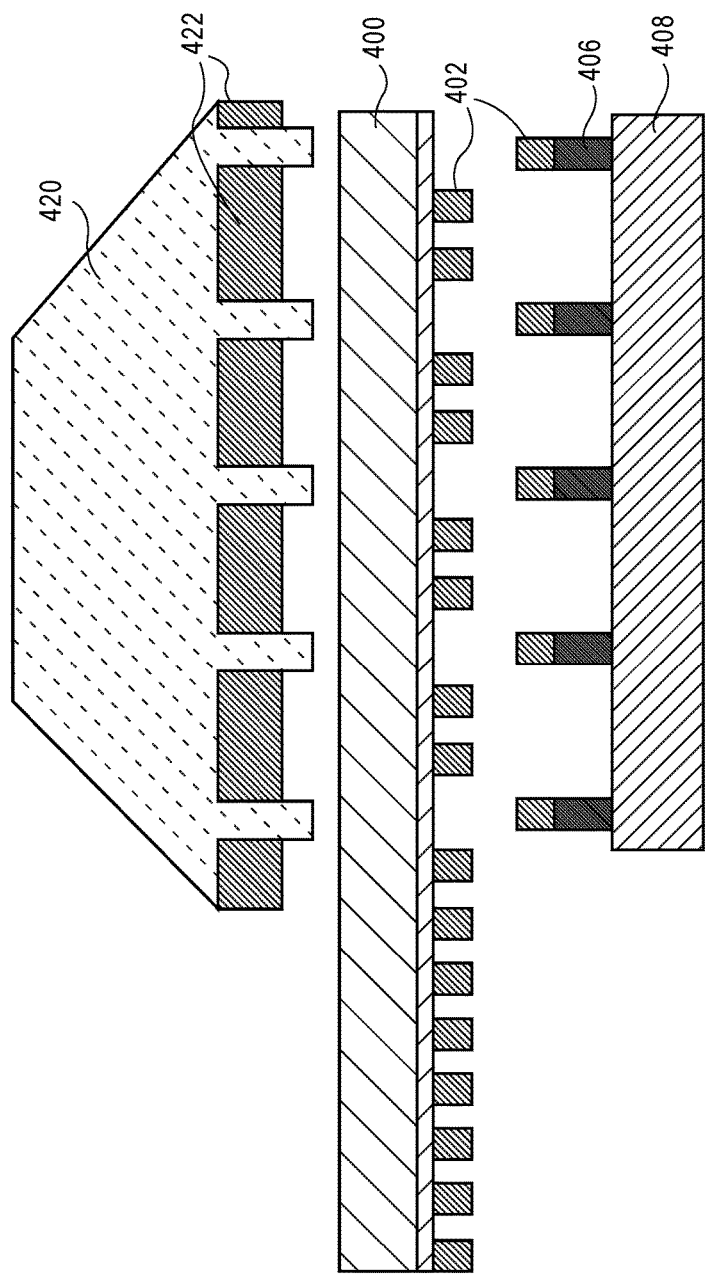
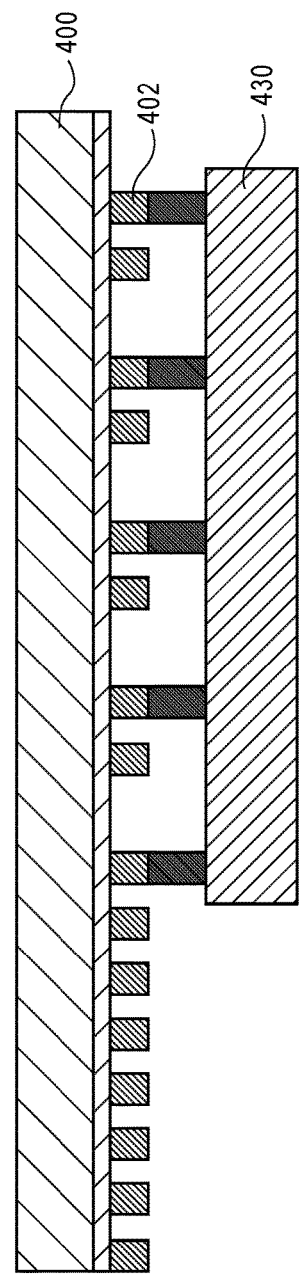
FIG. 4C
FIG. 4D

| Display Diagonal (inch) | Wafer Diameter | w(mm) | l(mm) | H Pixels | V Pixels | pd(um) | uLED Size (um) | Street (um) | Redund-ancy | pw (um) | ps/pw | N |
|---|---|---|---|---|---|---|---|---|---|---|---|---|
| 6.9 | 200 | 153 | 86 | 2560 | 1440 | 60 | 3.5 | 1 | 2 | 18 | 3 | 9 |
| 6 | 300 | 133 | 75 | 2560 | 1440 | 52 | 3.5 | 1 | 2 | 18 | 2 | 12 |
| 7.5 | 200 | 166 | 93 | 2560 | 1440 | 65 | 3.5 | 1 | 2 | 18 | 3 | 9 |
| 6.9 | 200 | 153 | 86 | 2560 | 1440 | 60 | 3.5 | 1 | 1 | 9 | 6 | 36 |
| 6 | 300 | 133 | 75 | 2560 | 1440 | 52 | 3.5 | 1 | 1 | 9 | 5 | 75 |
| 7.5 | 200 | 166 | 93 | 2560 | 1440 | 65 | 3.5 | 1 | 1 | 9 | 7 | 49 |

600

FIG. 6

MICRO LIGHT-EMITTING DIODE (LED) ELEMENTS AND DISPLAY

TECHNICAL FIELD

Embodiments of the disclosure are in the field of micro-LED displays.

BACKGROUND

Displays having micro-scale light-emitting diodes (LEDs) are known as micro-LED, mLED, and μLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) grid, and are represented using dots, squares, or rectangles. Pixels may be the basic building blocks of a display or digital image and with geometric coordinates.

BRIEF DESCRIPTION OF THE DRAWINGS

FIGS. 4A-4D illustrate cross-sectional views of a method of transferring pixel elements or RGB chips from a silicon wafer to a display backplane, in accordance with an embodiment of the present disclosure.

FIG. 6 is a Table showing a calculated number of displays per wafer under various conditions, in accordance with an embodiment of the present disclosure.

DESCRIPTION OF THE EMBODIMENTS

Figure 1:
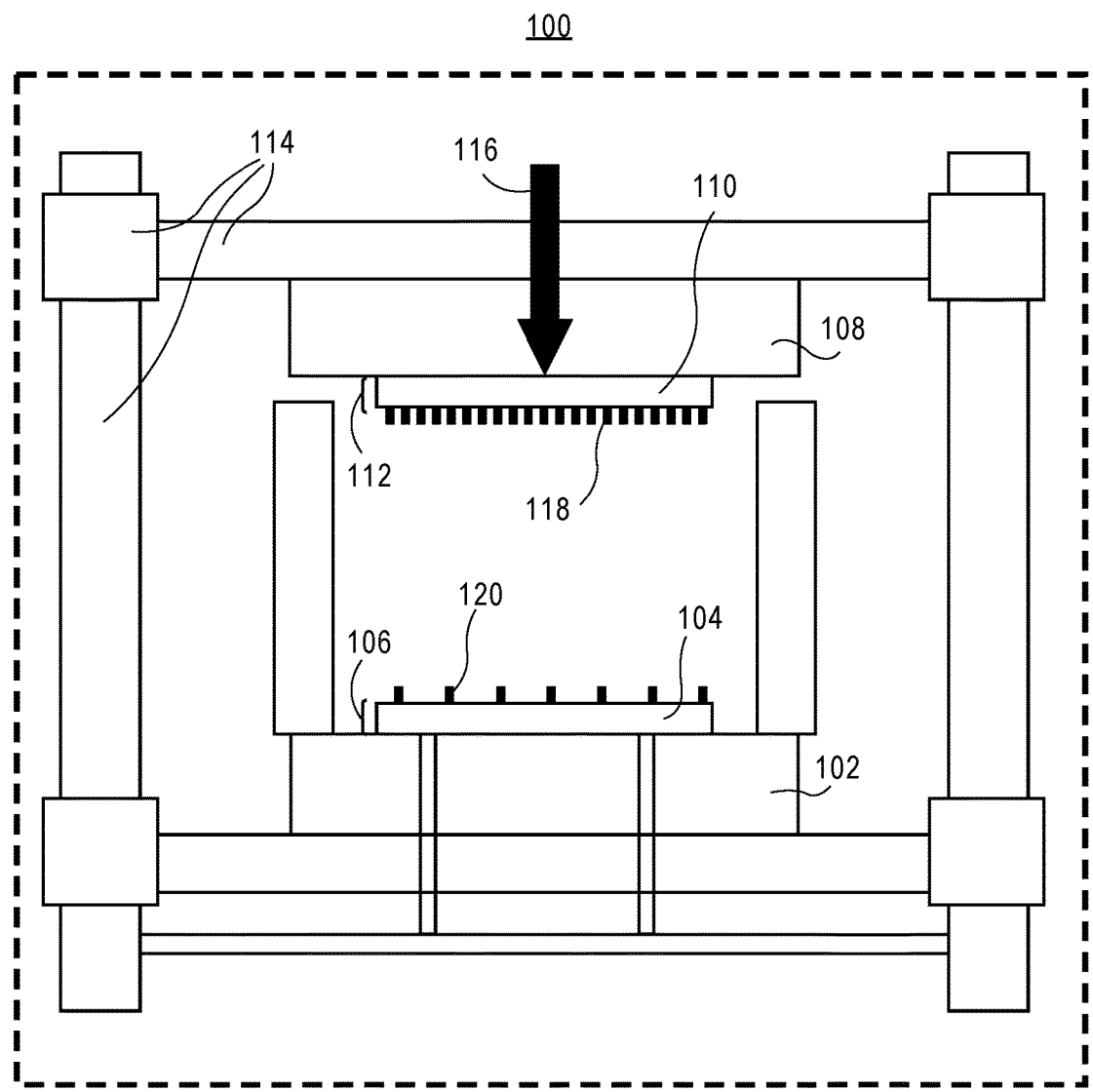
FIG. 1 illustrates a cross-sectional view of a schematic of a display bonder apparatus, in accordance with an embodiment of the present disclosure.

Micro light-emitting diode (LED) displays and assembly apparatuses are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to the fabrication of low-power micro LED displays, e.g., for converged mobility computing devices. In an embodiment, micro LED displays described herein consume two-fold less power compared to organic LED (OLED) displays. Such a reduction in power consumption may provide an additional approximately 8 hours of battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches to 11 inches.

To provide context, one state-of-the-art approach to fabricating micro LED displays involves direct transfer from source to target. Micro LED devices are fabricated on a source wafer and then transferred directly to a target substrate where the micro LED devices are assembled with driving electronics to provide a display. The approach, however, lacks compliance, and the associated topography may be problematic for multiple passes associated with transfer of three colors or more. Another state-of-the-art approach involves transfer with a stamp. For example, a stamp picks from the source wafer and the transfers to a target substrate where micro LED devices are assembled with driving electronics to provide a display. The approach, however, requires the need for pick up, bond, and release mechanisms. The approach is typically slow and expensive, and requires unique tooling.

To provide further context, displays based on inorganic micro LEDs (μLEDs) have attracted increasing attention for applications in emerging portable electronics and wearable computers such as head-mounted displays and wristwatches. Micro LEDs are typically first manufactured on Sapphire or silicon wafers (for example) and then transferred onto a display backplane glass substrate where on which active matrix thin-film transistors have been manufactured. The acceptable defect density after such a transfer is approximately 1 ppm. This low defect density requirement may be achieved by transferring two micro LEDs for each color (red, green and blue), a so-called "redundancy strategy". However, transferring more micro LEDs for redundancy results in higher manufacturing cost.

In accordance with an embodiment of the present disclosure, addressing both cost and defectivity requirements, monolithic red, green and blue pixels are manufactured on a wafer and then transferred as a whole pixel, as opposed to transferring individual micro LEDs with different colors. As described herein, source wafers are fabricated having individual red green blue (RGB) pixels (chips) thereon. Wafer-to-wafer bonding equipment and process technologies are then implemented to transfer micro LEDs from a source wafer to a target display backplane substrate, either directly or through an intermediate carrier plate.

In a first example, FIG. 1 illustrates a cross-sectional view of a schematic of a display bonder apparatus, in accordance with an embodiment of the present disclosure.

Referring to FIG. 1, a display bonder apparatus 100 includes a first support 102 for holding a display backplane substrate 104 in a first position 106. A second support 108 is for holding a carrier plate 110 in a second position 112. The second position 112 is over the first position 106. In one embodiment, a piston 114 is coupled to the second support 108. The piston 114 is for moving the carrier plate 108 from the second position 112 toward the first position 106. In a further embodiment, the piston 114 applies a force 116 to the carrier plate 108 to transfer light-emitting diode (LED) pixel elements 118 from the carrier plate 108 and bond to metal bumps 120 on the display backplane substrate 104.

In an embodiment, the carrier plate 108 holds the micro LEDs 118 using a bond layer (e.g., a pressure sensitive adhesive) where RGB micro LED chips are attached. The bond layer is brought into contact with the display backplane substrate 104 having the metal bumps 120, such that the micro LED metal contacts and backplane metal bumps 120 are opposite to one another. In one embodiment, the bonding process involves orienting the two substrates (carrier plate and display substrate) parallel to each other and compressing the two substrates together by applying force 116 on the outer surface of the carrier plate 110. The force 116 is usually applied to the center of the stack with a piston-type mechanism. The bonder apparatus 100 may provide precise bonding and may be suitable for bonding one substrate pair at a time. The bonding apparatus may be provided with a vacuum chamber (or any controlled atmosphere) and an aligner. The substrates 104 and 110 may be aligned in the aligner, loaded in the controlled atmospheric chamber, and then bonded to one another.

In an embodiment, the display bonder apparatus 100 is used in a transfer process where an entire array of micro LEDs is adhered to a pressure sensitive adhesive (PSA)-coated carrier plate which is then aligned in close proximity to the target substrate. Thermo-compression bonding (TCB) is then used to bond micro LEDs to metal pad bumps on the target substrate. After the transfer of micro LED RGB chips from source wafer to first target display substrate, micro LED RGB chips are detached (de-bonded) from the PSA carrier plate using, e.g., a mechanical force. A second target display substrate is brought in close proximity of the carrier plate but with a misalignment that is substantially or exactly equivalent to the RGB chip pitch on the source wafer in order to pick new RGB chips from the source wafer and to bond to a second target display substrate. In one embodiment, appropriate alignment is performed using infrared imaging or other optical or mechanical alignment approaches common to wafer-to-wafer bonders.

FIGS. 2A-2C, 2D(1), 2D(2) and 2E illustrate cross-sectional views of a method of transferring pixel elements or RGB chips from a carrier plate to a display backplane, in accordance with an embodiment of the present disclosure.

Figure 2E:
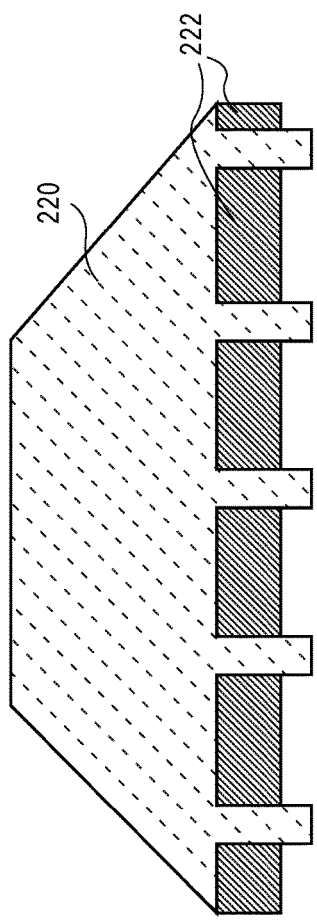
FIGS. 2A-2C, 2D(1), 2D(2) and 2E illustrate cross-sectional views of a method of transferring pixel elements or RGB chips from a carrier plate to a display backplane, in accordance with an embodiment of the present disclosure.
Figure 2E:
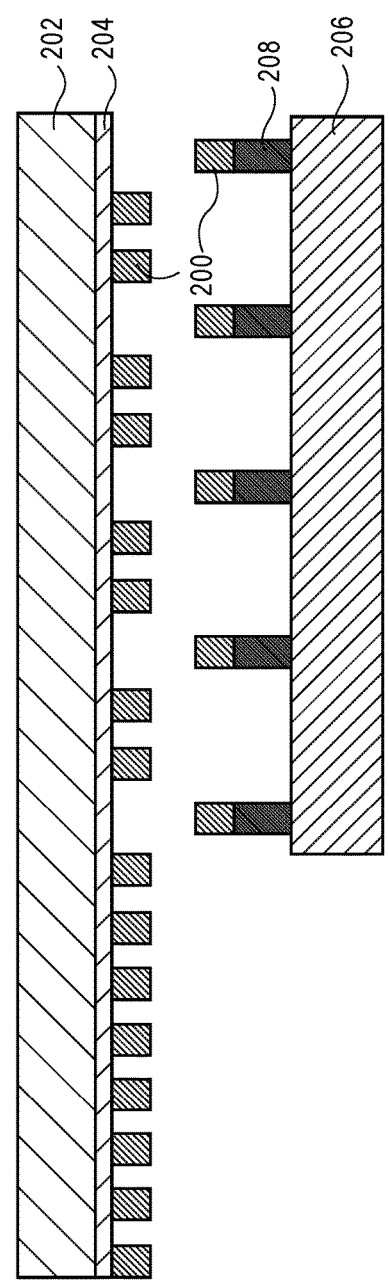
Figure 2E:
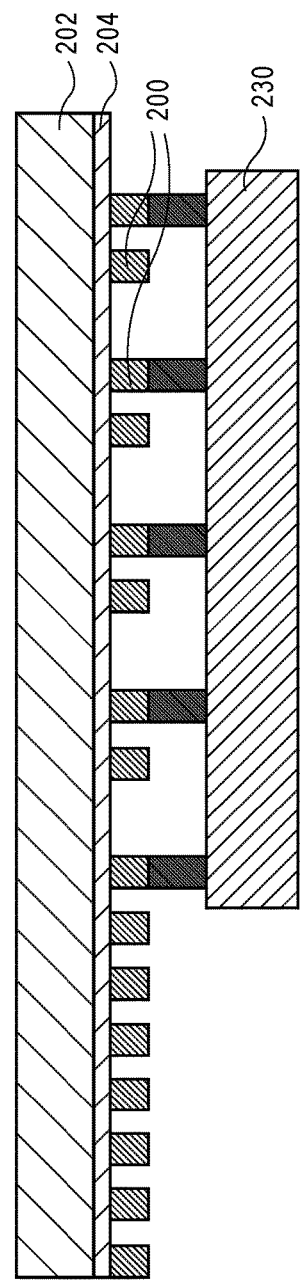

Referring to FIG. 2A, all micro LEDs 200 are transferred from a wafer 201 (such as a silicon wafer) to a carrier plate 202, e.g., to a pressure-sensitive adhesive layer 204 on the carrier plate 202. The carrier plate 202 is then aligned to a display backplane 206, e.g., aligned to metal bumps 208 of the display backplane 206, as is depicted in FIG. 2B. Referring to FIG. 2C, thermal compression bonding is performed for aligned micro LEDs 200 and metal bumps 208. In one embodiment, referring to FIG. 2D(1), the bonded micro LED chips 200 are detached from the carrier plate 202 using a mechanical force. In another embodiment, referring to FIG. 2D(1) the bonded micro LED chips 200 are detached from the carrier plate 202 using UV light 220 passed through a mask 222 that is aligned with display backplane bump 208 pattern. In an embodiment, referring to FIG. 2E, either following the mechanical detach or the UV detach, the remaining micro LED chips 200 are aligned to a new display backplane 230.

In an embodiment, the thermal compression bonding is performed at a temperature in the range of 25° C. to 430° C., and at a pressure in the range of 1-2 MPa. In an embodiment, the pressure-sensitive adhesive layer 204 is coated on the carrier plate 202. In one embodiment, the adhesive is one which has large heat resistance properties (e.g., high temperature cohesive strength) and which also has high adhesive properties under rigorous conditions. The term "pressure sensitive adhesive" may be used to refer to adhesives that can be adhered to a surface and yet can be stripped from the surface without transferring more than trace quantities of adhesive to the surface, and further may be re-adhered to the same or another surface because the adhesive retains some or all of its tack and adhesive strength. In a particular embodiment, a silicone pressure sensitive adhesive is used.

In a specific embodiment of the approach described above, micro LEDs are transferred from a "Mother Wafer" to a thin film transistor (TFT) backplane. The micro LED wafer (e.g., silicon) is bonded on the device side to a "transparent" carrier plate coated with "conductive adhesive" or adhesive that has metal particles. The back of Si wafer holding the micro LEDs is irradiated with an infrared IR laser to release all micro LEDs to the carrier plate. The IR laser ablates a conductive layer used as a nucleation layer to grow nanowire LEDs. The conductive nucleation layer may serve as a releasable layer that can be substantially or completely ablated (vaporized) using low-power mid-IR radiation to de-bond the device from the substrate. Metal such as Cu, Au, or Sn is deposited on the micro LED exposed side. Alignment of the carrier plate and the TFT backplane is performed followed by a thermo-compression bonding process. Irradiation using a pulsed IR or UV laser beam may be performed through the transparent carrier plate locally on micro LEDs that are bonded to the TFT backplane. The micro LEDs are released from the carrier plate to the TFT backplane.

In another embodiment, source wafers that have RGB pixels (chips) are provided. Wafer-to-wafer bonding equipment and process technologies are implemented to directly transfer micro LEDs from the source wafer to a target display backplane substrate.

Figure 3:
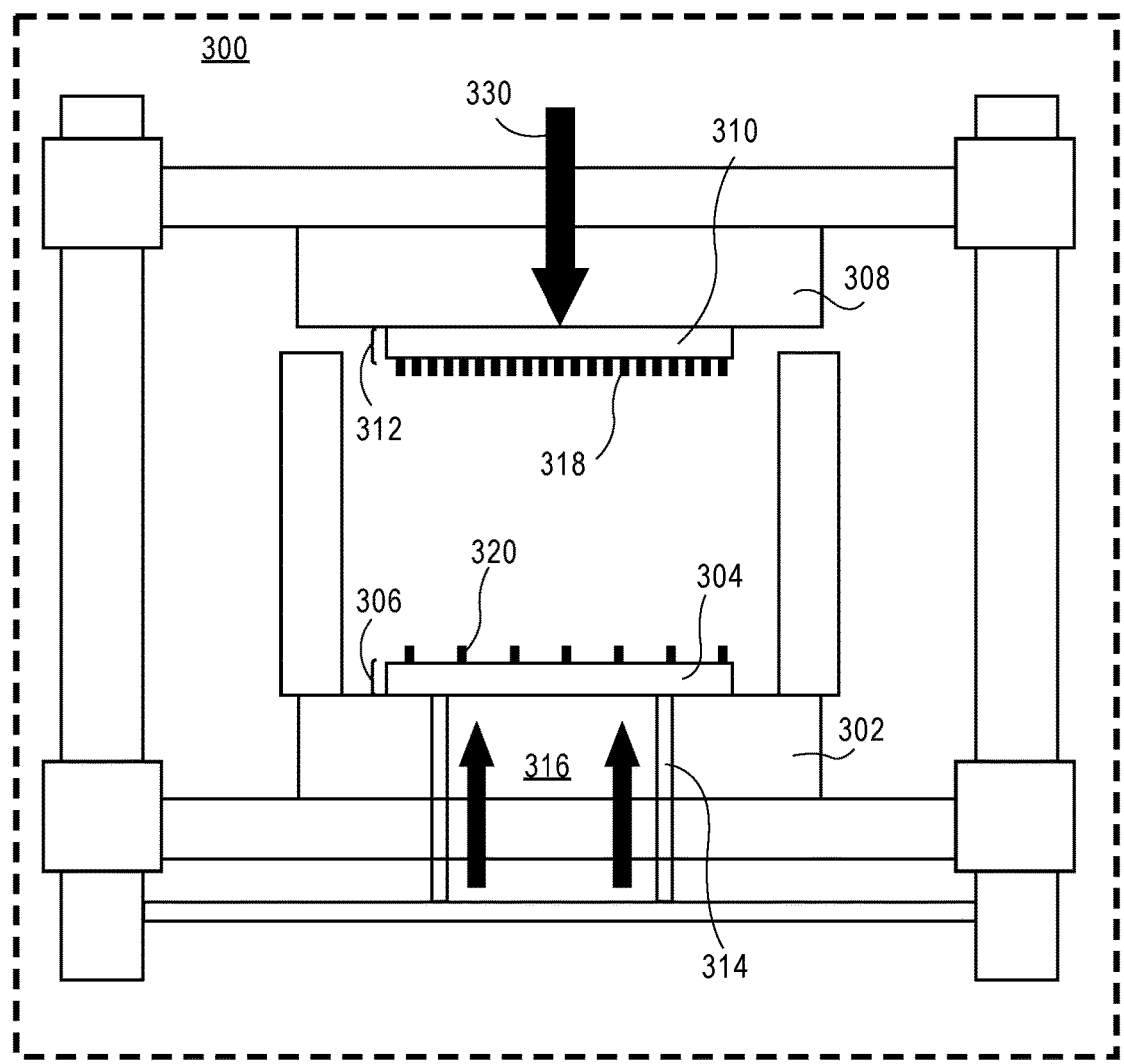
FIG. 3 illustrates a cross-sectional view of a schematic of another display bonder apparatus, in accordance with another embodiment of the present disclosure.

In a second example, FIG. 3 illustrates a cross-sectional view of another schematic of a display bonder apparatus, in accordance with another embodiment of the present disclosure.

Referring to FIG. 3, a display bonder apparatus 300 includes a first support 302 for holding a display backplane substrate 304 in a first position 306. A second support 308 is for holding a silicon wafer 310 in a second position 312. The second position 312 is over the first position 306. In one embodiment, a piston 314 is coupled to the first support 302. The piston 314 is for moving the display backplane substrate 304 from the first position 306 toward the second position 312. Further, the piston 314 applies a force 316 to the display backplane substrate 304 to bond light-emitting diode (LED) pixel elements 318 on the silicon wafer 310 to metal bumps 320 on the display backplane substrate 304. In an embodiment, the display bonder apparatus further includes an infra-red irradiation source 330 coupled to the second support 308.

In an embodiment, the display bonder apparatus 300 is used in a transfer process where a micro LED source wafer is brought into contact with a display substrate having metal bumps, such that the micro LED metal contacts and backplane metal bumps are opposite to one another. The bonding process involves orienting the two substrates (source wafer and display substrate) parallel to one another and compressing the two substrates together by applying force 316 on the outer surface of the display substrate. The force 316 may be applied to the center of the display substrate with a piston-type mechanism. The bonder apparatus 300 may provide precise bonding and may be suitable for bonding one substrate pair at a time. The bonding apparatus may be provided with a vacuum chamber (or any controlled atmosphere) and an aligner. The substrates may be aligned in the aligner, loaded in the controlled atmospheric chamber (vacuum/other), and thereafter bonded to each other.

FIGS. 4A-4D illustrate cross-sectional views of a method of transferring pixel elements or RGB chips from a silicon wafer to a display backplane, in accordance with an embodiment of the present disclosure.

Figure 4A:
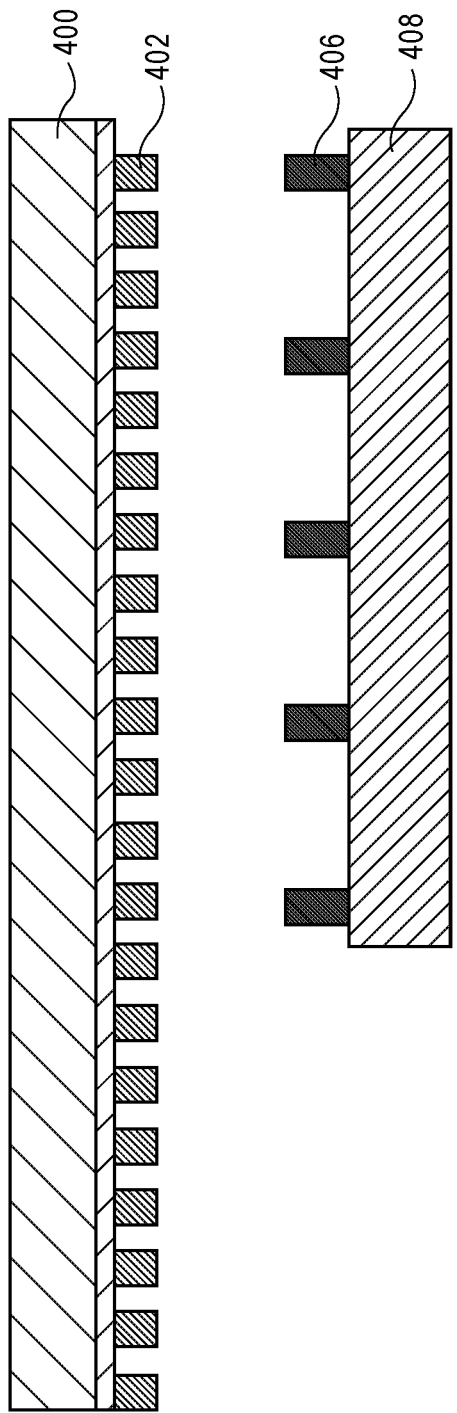
Figure 4B:
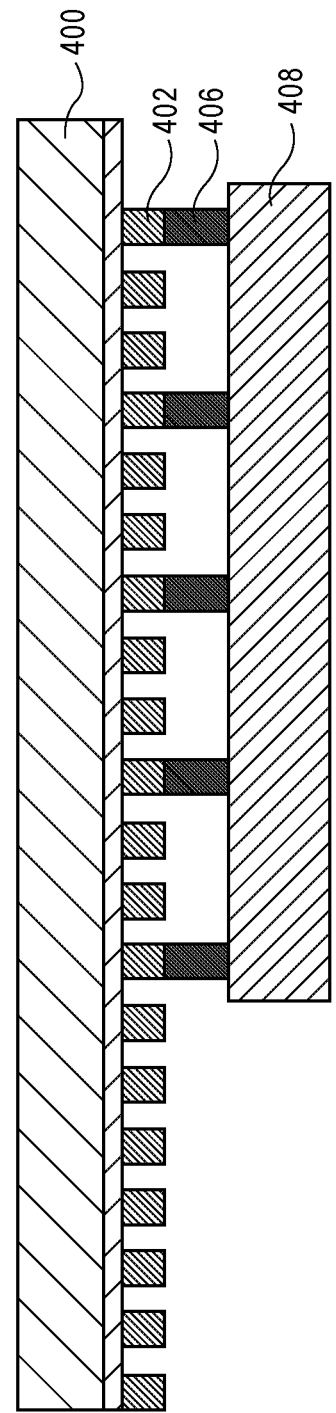

Referring to FIG. 4A, a silicon wafer 400 having micro LED pixel elements 402 thereon is aligned with metal bumps 406 of a backplane 408, such as a display thin film transistor (TFT) backplane. Thermal compression bonding is then performed for aligned micro LED pixel elements 402 and metal bumps 406, as is depicted in FIG. 4B. In one embodiment, the thermal compression bonding is performed at a temperature in the range of 25° C. to 430° C., and at a pressure in the range of 1-2 MPa. Referring to FIG. 4C, the bonded micro LED pixel elements 402 are detached from the silicon wafer 400 using IR light 420 passed through a mask 422 that is aligned with metal bumps 406 of the backplane 408. In an embodiment, referring to FIG. 4D, the remaining micro LED pixel elements 402 are aligned to a new display backplane 430.

In a specific embodiment of the approach described above, a source wafer is aligned in close proximity to a target substrate in a bonder tool 300. Thermo-compression bonding (TCB) is then used to bond micro LEDs to metal pad bumps on the target substrate. After bonding of micro LED RGB chips from the silicon source wafer to first target display substrate, micro LED RGB chips are detached (de-bonded) from the source wafer using infrared (IR) radiation through the silicon wafer. A second target display substrate is brought in close proximity of the silicon source wafer but with a misalignment that is equivalent to the RGB chip pitch on the source wafer in order to pick new RGB chips from source wafer to second target display substrate. The alignment may be performed using infrared imaging, optical, or mechanical approaches common to wafer-to-wafer bonders. In an embodiment, an IR laser ablates a conductive layer used as a nucleation layer to grow nanowire LEDs. The conductive nucleation layer may serve as a releasable layer that can be substantially or completely ablated (vaporized) using low-power mid-IR radiation to de-bond the device from the substrate.

Figure 5:
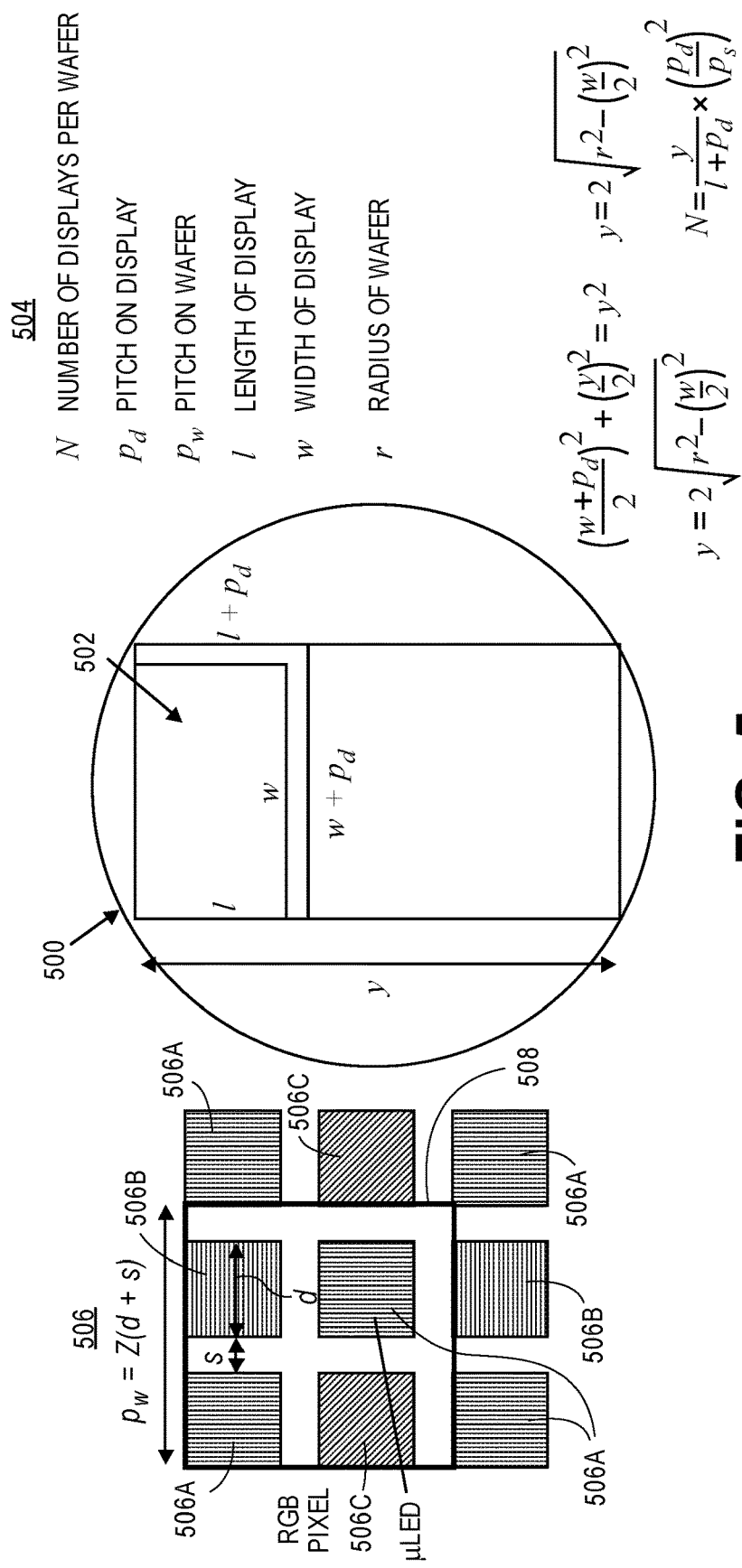
FIG. 5 illustrates a plan view demonstrating how a display backplane is moved over a carrier plate wafer or silicon wafer to transfer RGB pixels (chips), and a corresponding pixel region, in accordance with an embodiment of the present disclosure.

FIG. 5 illustrates a plan view demonstrating how a display backplane is moved over a carrier plate wafer or silicon wafer to transfer RGB pixels (chips), and a corresponding pixel region, in accordance with an embodiment of the present disclosure.

Referring to FIG. 5, a wafer 500 has an overlaying display region 502 aligned therewith. The number of displays per wafer is provided based on the parameters 504. An enlarged view of a plurality of micro LEDs 506 making up display 502 is shown on the left-hand side of FIG. 5. In the particular embodiment shown, the plurality of micro LEDs 506 includes red micro LEDs 506A, blue micro LEDs 506B, and green micro LEDs 506C. A pixel 508 is shown as a 2×2 grouping of four of the micro LEDs.

As shown, in an embodiment, a pixel 508 includes two red, one blue and one green micro LEDs. In another embodiment, pixel 508 includes two blue, one red and one green micro LEDs. In another embodiment, pixel 508 includes two green, one red and one blue micro LEDs.

FIG. 6 is a Table 600 showing a calculated number of displays per wafer under various conditions, in accordance with an embodiment of the present disclosure. Referring to Table 600, it is possible to generate 9-75 displays per wafer depending on the wafer size, display size, display resolution, and micro LED size. It is to be appreciated that when two RGB chips per pixel are transferred to display substrate to guarantee high yield (redundancy), a relatively smaller number of displays per wafer may be obtained.

Figure 7:
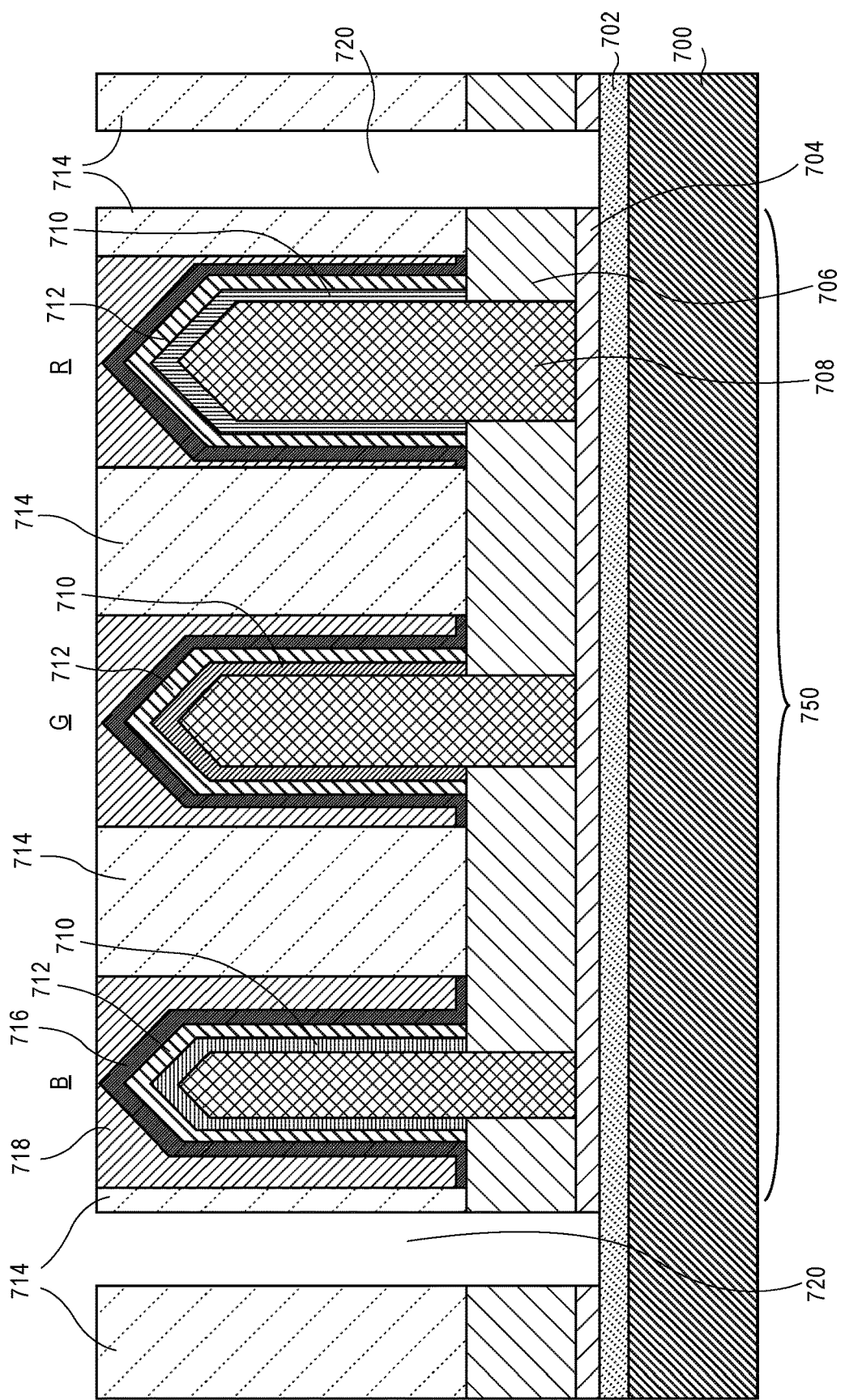
FIG. 7 illustrates a cross-sectional view of an RGB chip with three nanowire LEDs, in accordance with an embodiment of the present disclosure.

FIG. 7 illustrates a cross-sectional view of an RGB chip with three nanowire LEDs, in accordance with an embodiment of the present disclosure. Referring to FIG. 7, although shown as three different color micro-LEDs across (e.g., blue, green, red from left-right), the three are shown in this manner for illustrative purposes only. It is to be appreciated that for a pixel such as 2×2 pixel element 508 of FIG. 5, only two micro LEDs would be viewable for a given cross-section. It is to be appreciated that a variety of arrangements of micro LEDs may be suitable to make a single pixel. In one embodiment, three micro LEDs are arranged side-by-side, as depicted in FIG. 7. In another embodiment, four micro LEDs are arranged a 2×2 arrangement, as is depicted in FIG. 5. In another embodiment, nine micro LEDs are arranged a 3×3 arrangement, etc.

With reference again to FIG. 7, in a particular embodiment, a source micro LED wafer 700 (such as a silicon wafer) has "RGB Chips" monolithically grown thereon. The silicon wafer 700 is first coated with aluminum nitride (AlN) buffer layer 702, e.g., having a thickness of approximately 50 nanometers. The AlN buffer layer 702 may have a bandgap of about 6 eV and may be transparent to infrared radiation. A metal-based nucleation layer (MNL) 704 is then deposited on the AlN buffer layer 702. The MNL 704 may have a thickness in the range of 50-100 nm and may be crystalline or polycrystalline. A silicon nitride mask 706 is then deposited on the MNL. Lithography may then be used to open holes in the silicon nitride mask 706 mask with diameters carefully chosen to accommodate the subsequent formation of LEDs that emit red, green, and blue colors. GaN nanowire cores are then grown, e.g., by metal organic chemical vapor deposition (MOCVD), as seeded from the MNL 704. The nanowire cores have diameters in the range 80 nm to 200 nm.

Referring again to FIG. 7, indium gallium nitride (InGaN) shells 710 are grown around the GaN cores 708, e.g., using MOCVD. The amount of indium in the InGaN shells 710 depends on the GaN core diameter. In an embodiment, smaller core diameter result in the growth of InGaN shells with smaller indium content. Larger core diameters result in the growth of InGaN shells with larger indium content. For blue (B) color emission, the indium content is approximately 20%. For green (G) color emission, the indium content is approximately 30%. For red (R) color emission, the indium content is approximately 40%. A p-type GaN cladding layer 712 may then be formed around the InGaN shells 710, e.g., using MOCVD. The core-shell nanowires are the covered by an insulating material layer 714, e.g., a silicon oxide (SiOx) layer. A lithography and etch may then be used to expose the p-GaN cladding layers 712 for all color core-shell nanowire structures. Atomic layer deposition may then be used to conformally deposit a metal layer 716 on the p-GaN cladding layers 712. A metal fill process may then be performed to fill in contact metals 718 for the three color LED structures.

Referring more generally to FIG. 7 and the pixel element 508 of FIG. 5, a semiconductor structure includes a silicon wafer 700 and plurality of pixel elements 750. Each of the pixel elements 750 includes a first color nanowire LED, a second color nanowire LED (the second color different than the first color), and a pair of third color nanowire LEDs (the third color different than the first and second colors). A continuous insulating material layer 714 is laterally surrounding the first color nanowire LED, the second color nanowire LED, and the pair of third color nanowire LEDs. Adjacent pixel elements are separated from one another by a trench 720 between corresponding continuous insulating material layers 714.

In an embodiment, for each of the pixel elements 750, the first color is red, the second color is green, and the third color is blue. In another embodiment, for each of the pixel elements 750, the first color is red, the second color is blue, and the third color is green. In another embodiment, for each of the pixel elements 750, the first color is blue, the second color is green, and the third color is red. In an embodiment, for each of the pixel elements 750, the first color nanowire LED, the second color nanowire LED, and the pair of third color nanowire LEDs have a 2×2 arrangement from a plan view perspective, such as described in association with FIG. 5.

In an embodiment, for each of the pixel elements 750, the first color nanowire LED, the second color nanowire LED, and the pair of third color nanowire LEDs include gallium nitride (GaN) cores. In an embodiment, for each of the pixel elements 750, the first color nanowire LED, the second color nanowire LED, and the pair of third color nanowire LEDs include indium gallium nitride (InGaN) shells. In an embodiment, for each of the pixel elements 750, the continuous insulating material layer includes silicon oxide or carbon-doped silicon dioxide.

In another aspect, other nanowire-based LEDs for micro LED displays are described. The fabrication of LEDs with high power efficacies for three color LED emitters may enable power reductions with micro LED displays. In an embodiment, a device structure (e.g., nanowire LED), and a process technology to fabricate a device structure that has high power efficacy for red, green and blue color emitters at the same time is described.

It is to be appreciated that InGaN may be a suitable material for the development of various optical devices in the entire visible spectral range, at least in part due to the tunability of the bandgap energy of the InGaN material by adjusting the indium content. For example, a low-In-content InGaN-based blue light-emitting diode (LED) may exhibit an external quantum efficiency (EQE) of approximately 83%. However, the EQEs of long-wavelength LEDs emitting light in the green, yellow, orange, and red regions are much lower. Thus, a need remains for long wavelength, high-In-content InGaN-based LEDs to achieve high efficiency. Addressing the above issue, in an embodiment, a nitride device structure and its method of manufacture are described.

To provide context, for InGaN/GaN quantum wells, the peak emission wavelength increases with increasing the indium content in InGaN until a critical value where the emission wavelength starts to decrease again. For high indium contents (e.g., greater than 40% of the total In and Ga concentration), the emission wavelength can be lower than theoretically predicted from bandgap calculations since quantum confinement may dominate. It is understood that $In_{0.2}Ga_{0.8}N/In_{0.4}Ga_{0.6}N$ quantum wells offer a way reach efficient red (e.g., wavelength in the range of 610-630 nanometers) LEDs for non-polar structures. Not to be bound by theory, but it is understood that a relatively thicker high quality $In_{0.4}Ga_{0.6}N$ layer can be grown on $In_{0.2}Ga_{0.8}N$ as opposed to growing $In_{0.4}Ga_{0.6}N$ layer on GaN.

In an embodiment, a high efficiency red emission structure is fabricated using a GaN-based material system. In one such embodiment, following the fabrication of an ordered n-type GaN nanowire array, the remainder of the LED structure is grown radially around the nanowires. A typical structure includes a shell layer including an n-type GaN layer and $In_xGa_{1-x}N$ underlayer with x in the range of 0.15-0.25 which may act as a buffer. An $In_yGa_{1-y}N$ layer is on the $In_xGa_{1-x}N$ underlayer (and may be included in a set of $In_yGa_{1-y}N$/GaN multi-quantum well (MQW) active layers) with y in the range of 0.4-0.45. An undoped GaN layer and/or AlGaN electron blocking layer may be included as the next outer layer. Finally, a p-type GaN (or p-type ZnO) cladding layer may be included.

Figure 8A:
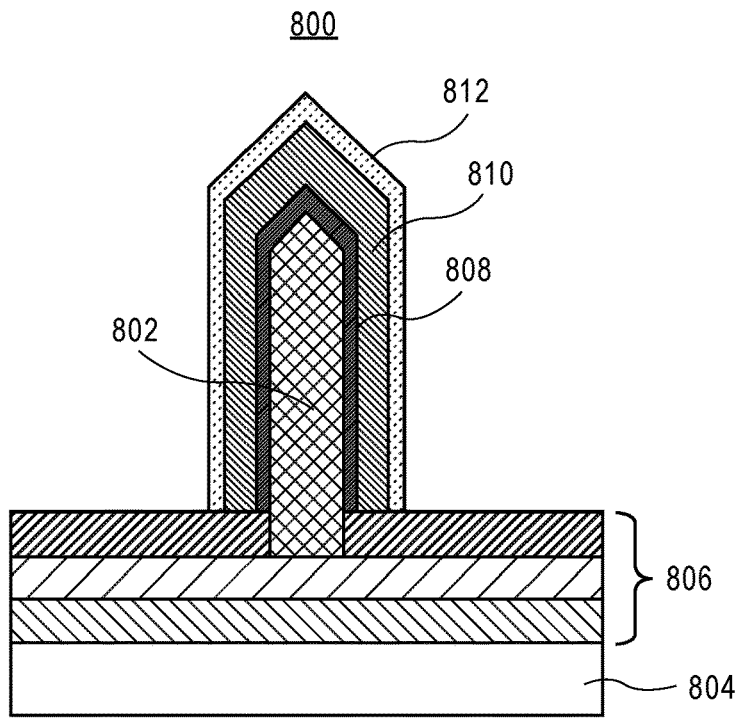
FIG. 8A illustrates a cross-sectional view of a GaN nanowire based LED highlighting certain layers of the LED, in accordance with an embodiment of the present disclosure.

FIG. 8A illustrates a cross-sectional view of a GaN nanowire based LED highlighting certain layers of the LED, in accordance with an embodiment of the present disclosure. In the exemplary embodiment of FIG. 8A, an LED 800 includes an n-type GaN nanowire 802 above a substrate 804, which may be a Si(111) substrate or sapphire substrate. Intervening layers 806, such as nucleation layers, may be included. An $In_{0.2}Ga_{0.8}N$ shell "buffer" layer 808 is included on the n-type GaN nanowire 802. An active $In_{0.4}Ga_{0.6}N$ layer 810 is included on the $In_{0.2}Ga_{0.8}N$ shell "buffer" layer 808. In one embodiment, the $In_{0.4}Ga_{0.6}N$ layer 810 emits red color (e.g., having a wavelength in the range of 610-630 nanometers). A p-GaN or p-ZnO cladding layer 812 is included on the $In_{0.4}Ga_{0.6}N$ layer 810.

In a second such embodiment, following the fabrication of an ordered n-type $In_xGa_{1-x}N$ nanowire array with x in the range of 0.15-0.25, the remainder of the LED structure is grown radially around the nanowires. An $In_yGa_{1-y}N$ layer is on the $In_xGa_{1-x}N$ nanowires (and may be included in a set of $In_yGa_{1-y}N$/GaN multi-quantum well (MQW) active layers) with y in the range of 0.4-0.45. An undoped GaN layer and/or AlGaN electron blocking layer may be included as the next outer layer. Finally, a p-type GaN (or p-type ZnO) cladding layer may be included.

Figure 8B:
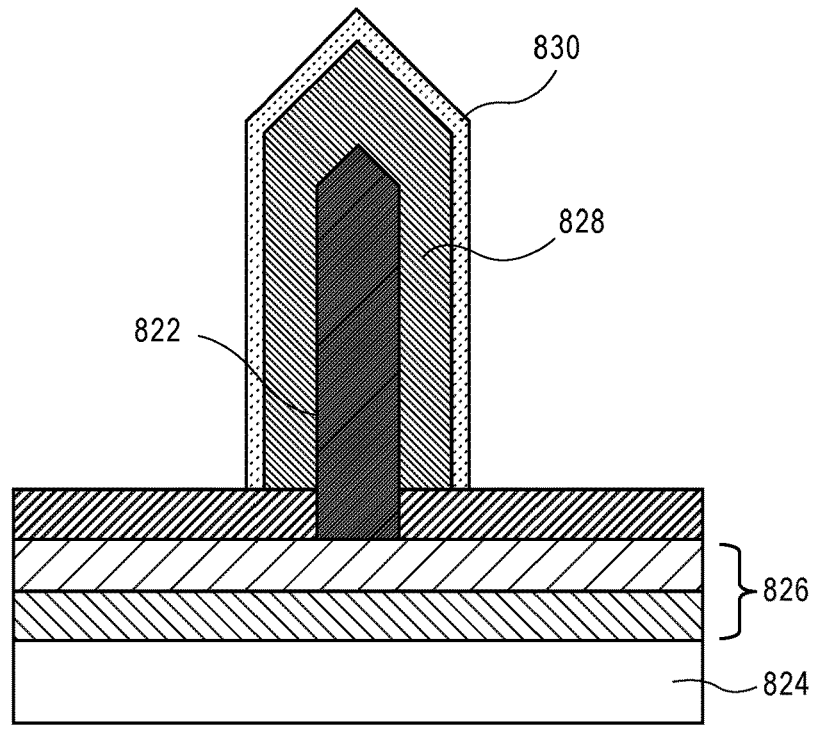
FIG. 8B illustrates a cross-sectional view of an InGaN nanowire based LED highlighting certain layers of the LED, in accordance with an embodiment of the present disclosure.

FIG. 8B illustrates a cross-sectional view of an InGaN nanowire based LED highlighting certain layers of the LED, in accordance with an embodiment of the present disclosure. In the exemplary embodiment of FIG. 8B, an LED 820 includes an $In_{0.2}Ga_{0.8}N$ nanowire 822 above a substrate 824, which may be a Si(111) substrate or sapphire substrate. Intervening layers 826, such as nucleation layers, may be included. An active $In_{0.4}Ga_{0.6}N$ layer 828 is included on the $In_{0.2}Ga_{0.8}N$ nanowire 822. In one embodiment, the $In_{0.4}Ga_{0.6}N$ layer 828 emits red color (e.g., having a wavelength in the range of 610-630 nanometers). A p-GaN or p-ZnO cladding layer 830 is included on the $In_{0.4}Ga_{0.6}N$ layer 828.

In both of the above described embodiments, the InGaN layers and the p-type GaN layers may be grown at relatively low temperatures (e.g., in the range of 500-600 degrees Celsius. In one embodiment, the InGaN layers and the p-type GaN layers are grown using hydrazine or hydrazine-ammonia mix as a nitrogen source. The growth at relatively low temperature (e.g., compared to conventional growth using ammonia as a nitrogen source) may suppress phase separation of the InGaN active layers.

It is understood that factors causing low efficiency in high-In-content InGaN-based LEDs include (1) defects in the InGaN active layer due to the lattice mismatch between $In_xGa_{1-x}N$ and GaN (e.g., lattice mismatch between InN and GaN is 11%), or (2) the piezoelectric field in the strained InGaN active layers becomes very large for high indium content. The piezoelectric field may cause low internal quantum efficiency owing to electron-hole separation in InGaN multiple quantum wells. In an embodiment, addressing one or more of the above issues, the structures described above and exemplified in FIGS. 8A and 8B may provide one or more of following benefits: (1) high integrity of InGaN active layers in nanowire LEDs (e.g., no phase separation) especially with indium content higher than 30%, (2) high power efficacy of the resulting nanowire LEDs including for red and green colors, (3) high power efficacy resulting in lower display power consumption, which is consideration for selecting micro LED displays compared to OLED displays.

It is to be appreciated that foundational geometries other than the above described nanowires may be used for LED fabrication. For example, in another embodiment, FIG. 8C illustrates a cross-sectional view of a GaN nanopyramid based LED highlighting certain layers of the LED, in accordance with an embodiment of the present disclosure. In the exemplary embodiment of FIG. 8C, an LED 840 includes an n-GaN nanopyramid 842 above a substrate 844, which may be a Si(111) substrate or sapphire substrate. Intervening layers 846, such as nucleation layers, may be included. An InGaN layer 848 is included on the GaN nanopyramid 842. A p-GaN or p-ZnO cladding layer 852 is included on the InGaN layer 848.

Figure 8D:
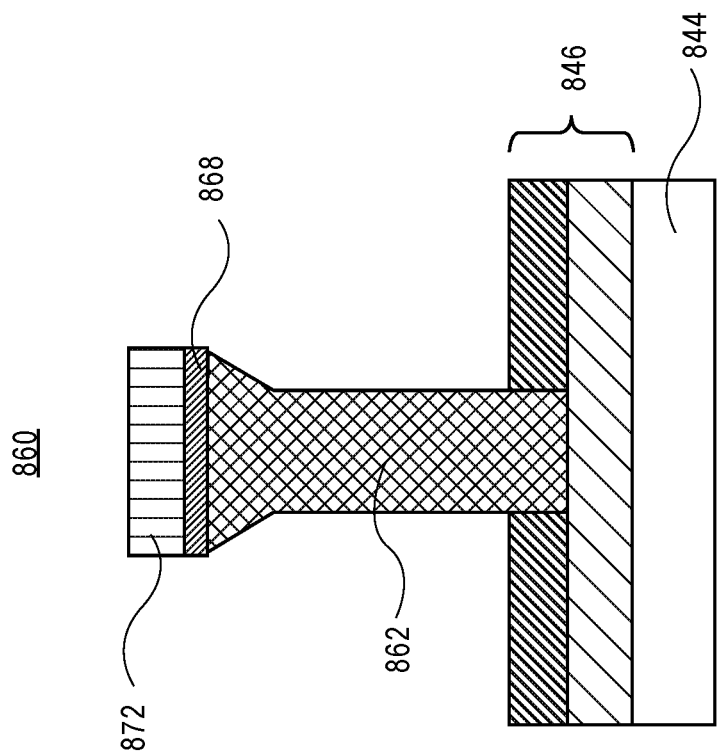
FIG. 8D illustrates a cross-sectional view of a GaN axial nanowire based LED highlighting certain layers of the LED, in accordance with an embodiment of the present disclosure.
Figure 8C:
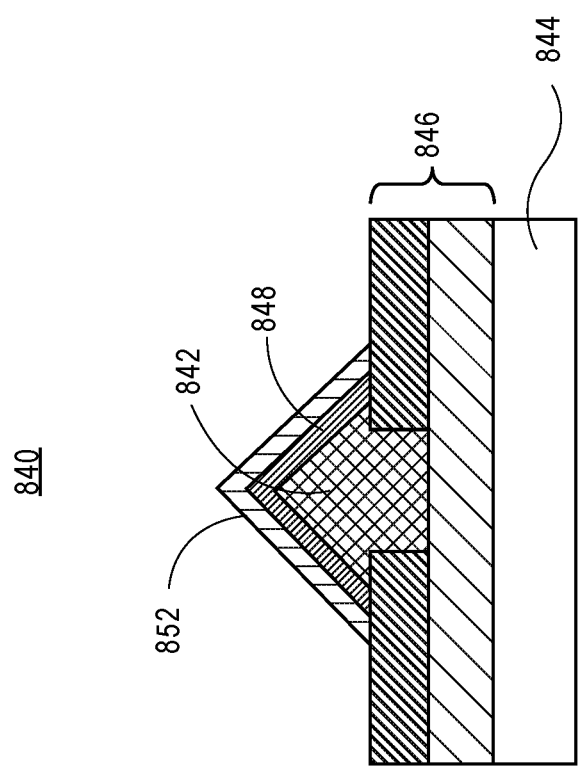
FIG. 8C illustrates a cross-sectional view of a GaN nanopyramid based LED highlighting certain layers of the LED, in accordance with an embodiment of the present disclosure.

In another embodiment, FIG. 8D illustrates a cross-sectional view of a GaN axial nanowire based LED highlighting certain layers of the LED, in accordance with an embodiment of the present disclosure. In the exemplary embodiment of FIG. 8D, an LED 860 includes an n-GaN axial nanowire 862 above a substrate 864, which may be a Si(111) substrate or sapphire substrate. Intervening layers 866, such as nucleation layers, may be included. An InGaN layer 868 is included on the GaN axial nanowire 862. A p-GaN or p-ZnO cladding layer 872 is included on the InGaN layer 868.

Figure 9:
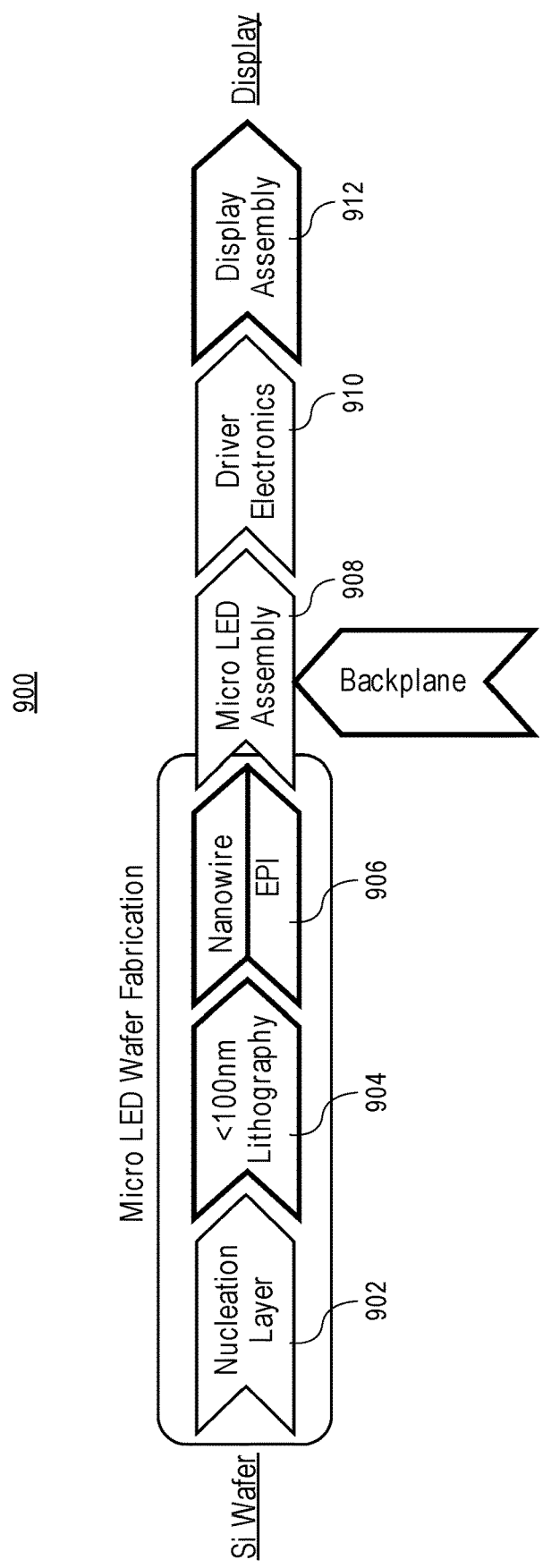
FIG. 9 is a flow diagram illustrating an RGB display production process, in accordance with an embodiment of the present disclosure.

In another aspect, FIG. 9 is a flow diagram 900 illustrating an RGB display production process, in accordance with an embodiment of the present disclosure. Referring to flow diagram 900, at operation 902, an Si wafer has a nucleation layer formed thereon. At operation 904, sub 100 nm lithography is used to pattern a layer on the nucleation layer, or to pattern the nucleation layer. At operation 906, nanowire growth is performed on the nucleation layer, e.g., by epitaxial deposition. At operation 908, a backplane is introduced into the micro LED assembly process. At operation 910, driver electrons are fabricated. At operation 912, display assembly is performed to finally provide a display.

In another aspect, micro LED displays are fabricated using fluidic self-assembly. In accordance with an embodiment of the present disclosure, source wafers that have RGB pixels (chips) are provided as a starting structure. Fluidic self-assembly is used to transfer RGB pixels from the source wafers to a display backplane.

Figure 10:
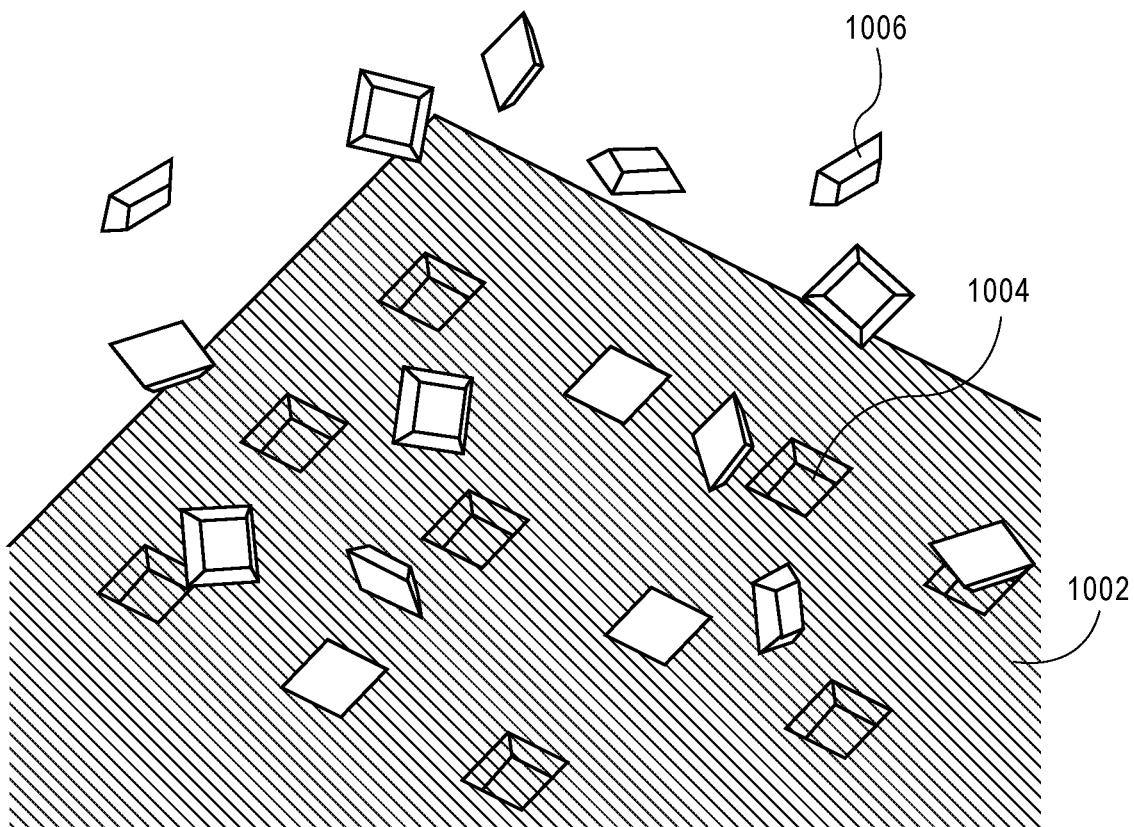
FIG. 10 illustrates a schematic of fluidic self-assembly of LED pixels in a backplane, in accordance with an embodiment of the present disclosure.

FIG. 10 illustrates a schematic of fluidic self-assembly of LED pixels in a backplane, in accordance with an embodiment of the present disclosure. Referring to FIG. 10, a display backplane 1002 has microgrooves 1004 therein. LED pixels 1006 are in fluidic motion and are driven to fill the microgrooves 1004.

Figure 11:
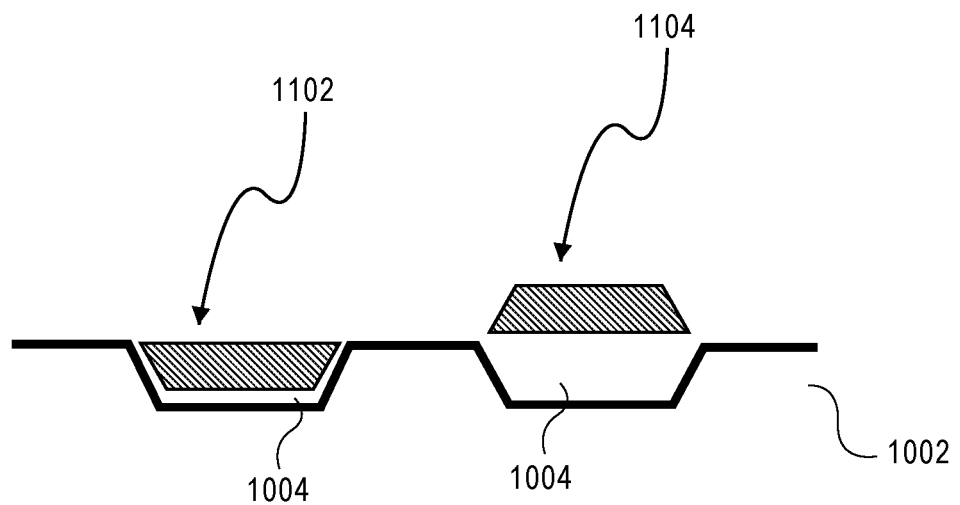
FIG. 11 illustrates the backplane of FIG. 10 having LED pixels in different landed orientations, in accordance with an embodiment of the present disclosure.

FIG. 11 illustrates the backplane of FIG. 10 having LED pixels in different landed orientations, in accordance with an embodiment of the present disclosure. Referring to FIG. 11, an LED pixel 1102 lands in a microgroove 1004 of the backplane 1002 with a "desirable" orientation. Another LED pixel 1104 lands in a microgroove 1004 of the backplane 1002 with an "undesirable" orientation.

Referring collectively to FIGS. 10 and 11, in fluidic self-assembly (FSA), chips to be assembled are mixed in a suitable fluid and allowed to move over a substrate having matching recesses for their self-assembly. In an example, trapezoidal chips are trapped and assembled in the trapezoidal recesses by fluidic and gravitational forces. The trapezoidal dies prevent upside down assembly. A chip is generally required to go completely into its recess to avoid being an obstacle for other chips.

Figure 12:
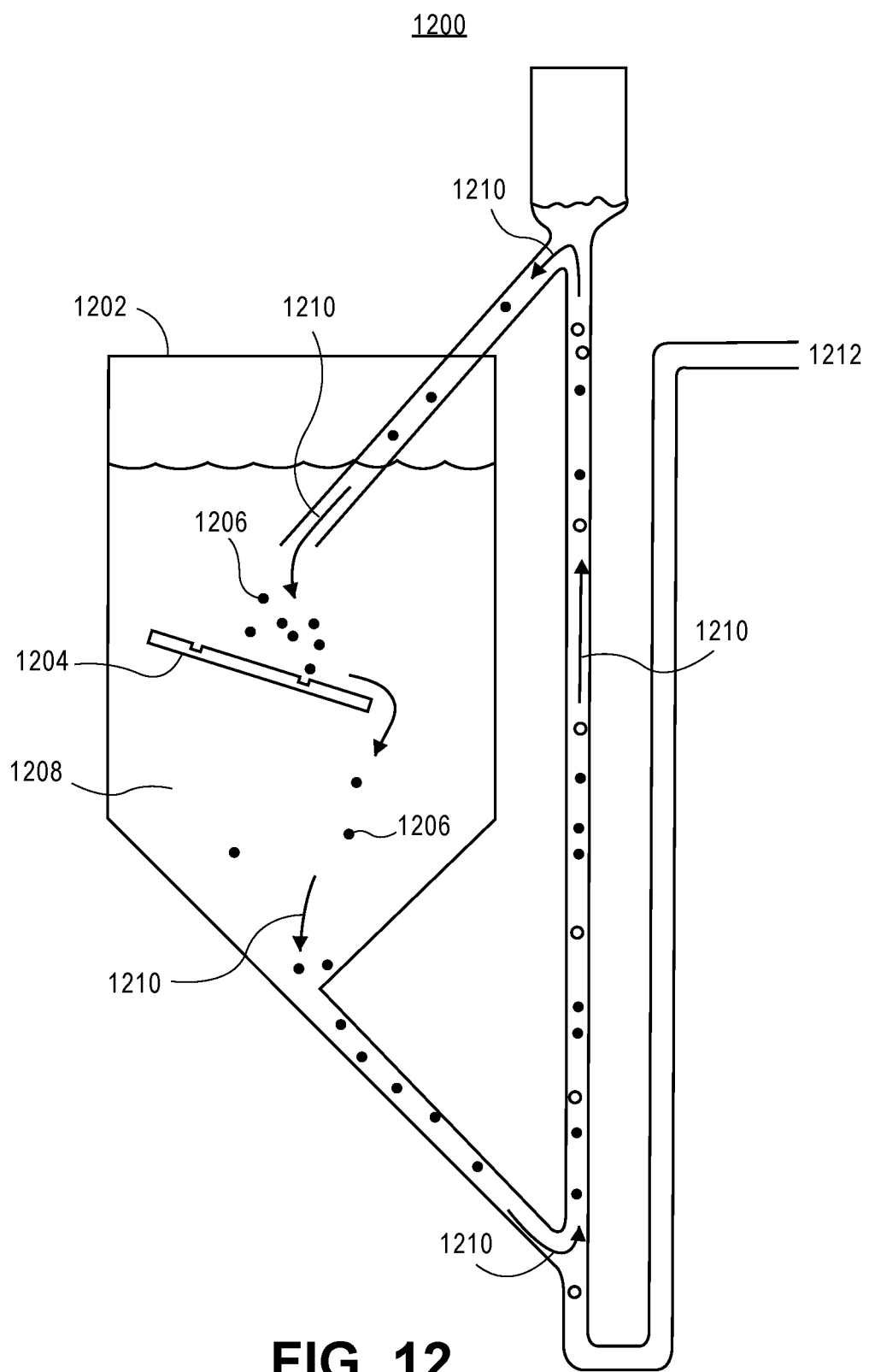
FIG. 12 illustrates a schematic view of a fluidic self-assembly apparatus for micro LEDs, in accordance with an embodiment of the present disclosure.

FIG. 12 illustrates a schematic view of a fluidic self-assembly apparatus 1200 for micro LEDs, in accordance with an embodiment of the present disclosure. Referring to FIG. 12, a tank 1202 holds a substrate 1204. Micro LED chips 1206 are circulated in a fluid 1208. Fluid flow 1210 is depicted by the arrows for continued circulation of the micro LED chips 1206 over the surface of the substrate 1204. The substrate 1204 may be a "temporary carrier plate" or the actual display backplane. A gas inlet 1212 provides gas (such as nitrogen) to generate fluid flow.

In an embodiment, an exemplary processing scheme includes the following operations: (1) fabrication of micro LEDs on, e.g., a 150 mm diameter sapphire wafers, a 200 mm diameter silicon wafers, or a 300 mm diameter silicon wafer, followed by (2) identification of micro LEDs that are not working. The non-functional LEDs may be identified according to the following approach: (a) shining UV light (e.g., having a wavelength in the range of 200 nm-400 nm) on micro LED wafers, (b) identifying "dark" spots on the wafer which represent defective micro LEDs using appropriate imaging technology (e.g., a CCD RGB camera), (c) using pulsed infrared laser irradiation from the silicon backside of the micro LED wafer to selectively detach the defective micro LEDs identified in (b), or (d) using pulsed UV laser irradiation from a sapphire backside of a micro LED wafer to selectively detach the defective micro LEDs identified in (b). The exemplary processing scheme continues with (3) using laser irradiation on the backside of the micro LED wafers (e.g., UV for sapphire wafers and infrared for silicon wafers) to detach the "good" micro LEDs into a container filled with an appropriate fluid.

Figure 13:
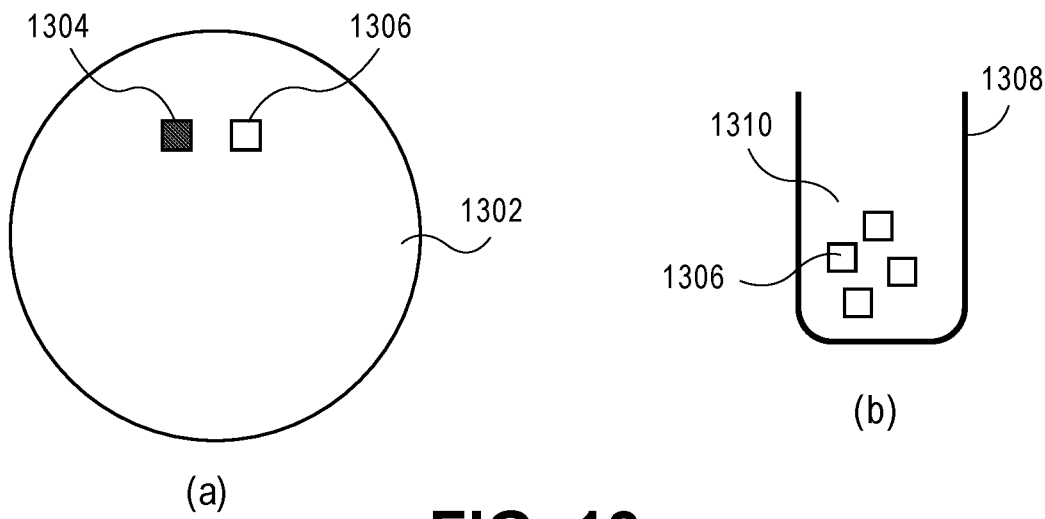
FIG. 13 illustrates (a) identification of non-functional LEDs and (b) suspension of functional LEDs in a fluid, in accordance with an embodiment of the present disclosure.

FIG. 13 illustrates (a) identification of non-functional LEDs and (b) suspension of functional LEDs in a fluid, in accordance with an embodiment of the present disclosure. A UV light is first illuminated on a source wafer 1302 and an image is taken using a CCD camera. Coordinates of "dark" spots are identified from image analysis. Pulsed infrared laser irradiation is applied to the backside of the wafer to selectively release the bad or non-functional dies 1304 for disposal. Pulsed infrared laser irradiation is applied again to release good or functional dies 1306 into a fluid 1308 container including a fluid 1310 used for fluidic self-assembly.

Figure 14:
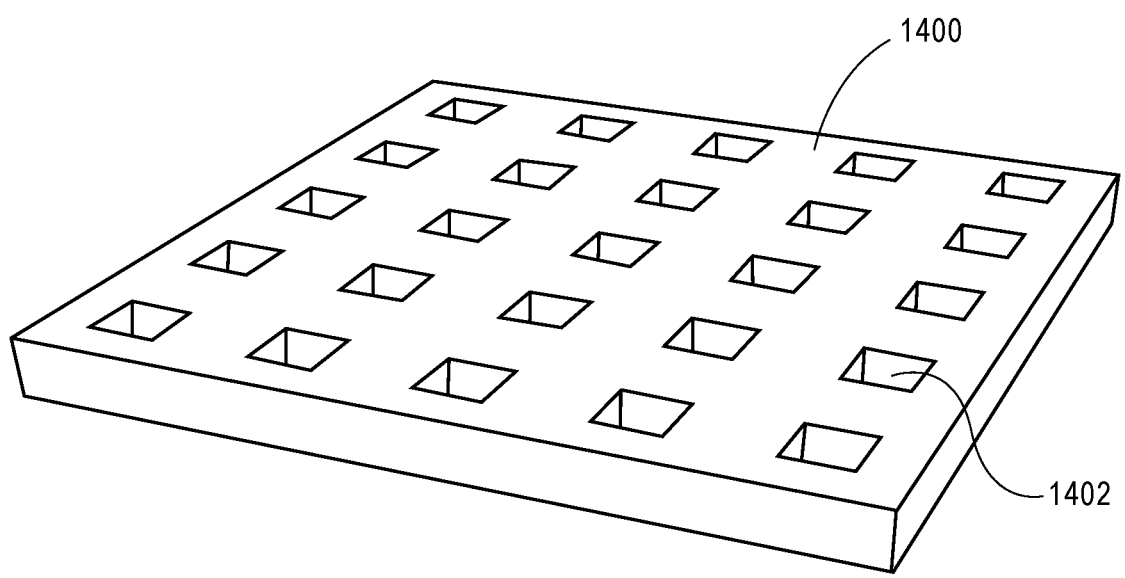
FIG. 14 illustrates an angled view of a carrier 1400 having microgrooves 1402 therein, in accordance with an embodiment of the present disclosure.

The exemplary processing scheme continues with (4) fabrication or providing of a temporary carrier plate with microgrooves of appropriate size (e.g., width, length and height) to receive micro LEDs from a fluid. In an embodiment, the microgrooves have a specific shape to selectively receive micro LEDs on a specific side. In one embodiment, a contact metal is disposed on the side for micro LED RGB pixel capture. FIG. 14 illustrates an angled view of a carrier 1400 having microgrooves 1402 therein, in accordance with an embodiment of the present disclosure.

Figure 15:
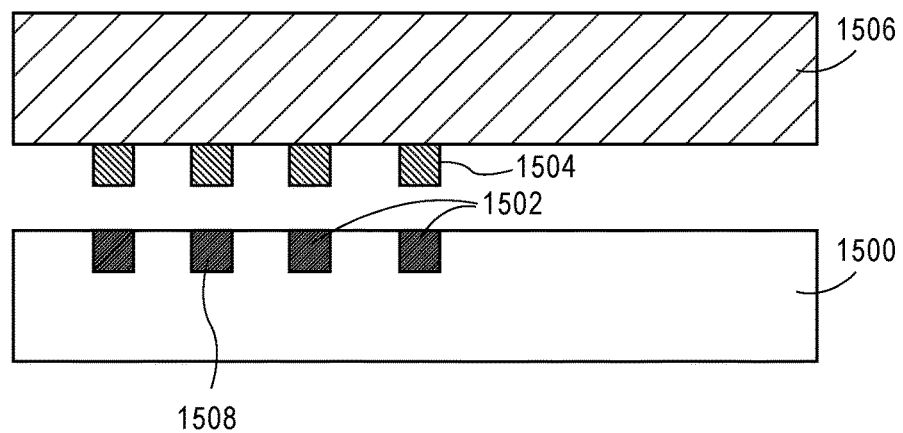
FIG. 15 illustrates a cross-sectional view of a process of bonding of micro LED chips in a temporary carrier plate to microbumps of a display backplane after the micro LED chips have been trapped into microgrooves on the temporary carrier plate using fluidic self-assembly, in accordance with an embodiment of the present disclosure.

The exemplary processing scheme continues with (5) dispensing the micro LED suspension onto the display or temporary carrier plate (TCP) with until all the microgrooves on the TCP are filled with micro LEDs. In an embodiment, the filling ratio meets a criteria of 1 ppm defect rate. The exemplary processing scheme continues with (6) bringing a display backplane (e.g., having contact bumps theron) in close proximity to the TCP. The contact bumps are then aligned to the micro LEDs on the TCP. FIG. 15 illustrates a cross-sectional view of a process of bonding of micro LED chips 1502 in a temporary carrier plate 1500 to microbumps 1504 of a display backplane 1506 after the micro LED chips 1502 have been trapped into microgrooves 1508 on the temporary carrier plate 1500 using fluidic self-assembly, in accordance with an embodiment of the present disclosure.

The exemplary processing scheme continues with using thermo-compression bonding (TCB) to bond the micro LEDs to the backplane (e.g., at a temperature less than approximately 400 degrees Celsius), and (8) depositing a cathode (e.g., a blanket film of indium tin oxide (ITO)) on the display backplane.

Figure 16:
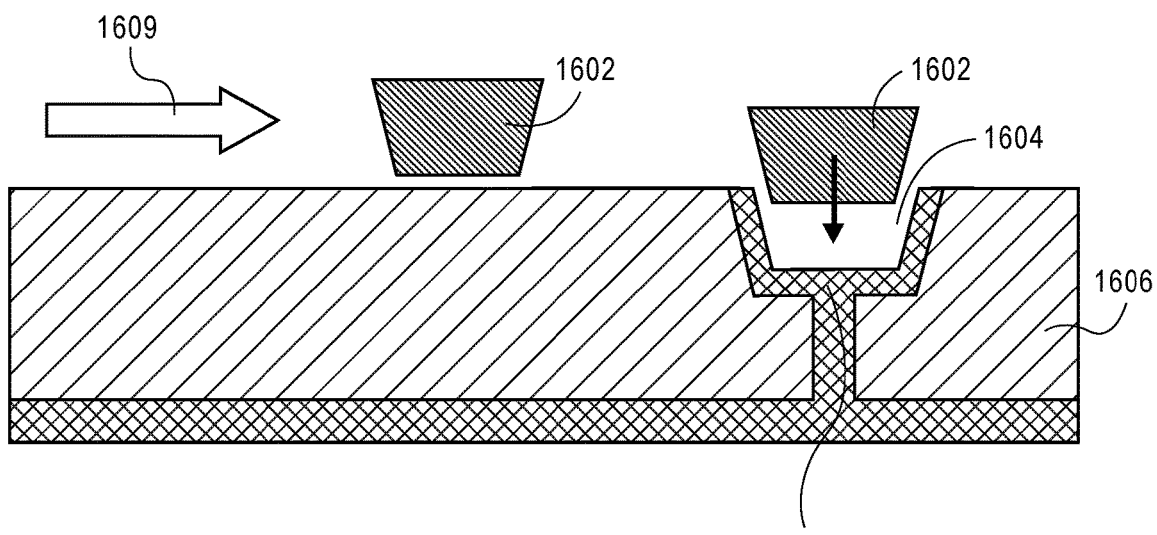
FIG. 16 illustrates a cross-sectional view of a process of assembling micro LED chips directly in microgrooves of a backplane, in accordance with an embodiment of the present disclosure.

In another embodiment, fluidic self-assembly is performed directly on a display backplane. FIG. 16 illustrates a cross-sectional view of a process of assembling micro LED chips 1602 directly in microgrooves 1604 of a backplane 1606, in accordance with an embodiment of the present disclosure. The microgrooves 1604 that trap the micro LED chips 1602 during fluid movement 1609 are fabricated directly on the display backplane 1606. In an embodiment, the microgrooves 1604 are lined with a conductive electrode material 1608, as depicted.

In an embodiment, using a fluidic self-assembly (FSA) approach provides higher throughput, higher transfer yield, and lower risk on equipment development. In an embodiment, fluidic self-assembly is defined as an assembly method in which the parts are designed to assemble spontaneously when they are brought together, e.g., typically by random interactions such as by stirring or vibrating the components. Fluids are used in the self-assembly process in order to provide a medium for the assembly. In one embodiment, the fluid reduces friction and can be used to circulate the components until they contact. In one embodiment, fluidic self-assembly is used for parallel fabrication of devices made up of many small components. Such self-assembly techniques are often massively parallel and therefore faster and cheaper than serial pick-and-place assembly.

In a particular embodiment, an electrophoretic assembly process is used. It is to be appreciates that fluidic self-assembly, as described herein, allows for the fabrication of GaN-based micro LEDs as densely packed as possible on a grown wafer to maximize the wafer area that is made into devices. For example, approximately 30 million devices can be made from a 300 mm diameter wafer. The micro LEDs can be dispensed over many display backplanes, since the unused micro LEDs may be recycled. In an embodiment, the micro LED chips (RGB pixels) are dispersed in deionized water with a surfactant as a dispersing agent. In a particular such embodiment, the suspension of micro LEDs and surfactant is then sonicated in a container using an ultrasonic bath in order to prepare a homogeneous suspension. Surfactants (e.g., dispersants) may be used to promote micro LEDs dispersion. In an embodiment, a surfactant is selected from the group consisting of cetyltrimethylammonium bromide, Triton X-100, and sodium dodecylbenzene sulfonate (SDBS).

In an embodiment, a micro LED suspension is deposited on a temporary carrier (e.g., having a plurality of types of microgrooves) as a film through a method such as filtration, dip coating, spin coating, electrophoretic deposition, or inkjet printing. In a particular embodiment, the micro LED is placed in a solution overlaying a temporary carrier plate. When an electrode on the display backplane is provided with a negative charge, the LED is transported to the electrode by electrophoresis.

In an embodiment, once all microgrooves are filled with the micro LED chips (RGB pixels), the temporary carrier plate is brought into close contact with a display backplane. The display backplane has a matrix of pixels (e.g., pixel size approximately 40 μm-45 μm) already fabricated on one side, with thin film transistors and "landing" pads for the micro LEDs. Alignment between the temporary carrier plate and the display backplane may be performed using, e.g., infrared imaging technology. Each micro LED is then aligned with a landing pad. The micro LEDs are bonded to the backplane using thermocompression bonding (TCB) or other suitable type of bonding approach.

In an embodiment, each microgroove can accept a single RGB pixel. In one such embodiment, the RGB pixel includes four micro LED devices arranged in a 2×2 matrix. Each micro LED has a size of approximately 1 μm×1 μm to 10 μm×10 μm. The micro LEDs may be separated by streets of size in the range 0.1-1 μm. In one embodiment, then, the size of the RGB pixel is approximately 12 μm×12 μm. In one embodiment, each micro LED is composed of an array of microwire LEDs. Each microwire LED has a diameter of approximately 1 μm. For example, for a micro LED with size of 5 μm×5 μm, there are approximately 20 microwires connected in parallel. Such a structure provided redundancy needed to achieve defect density of 1 ppm on a display.

In an embodiment, there are three types of micro LEDs (red, green and blue). In this case, the assembly process involves a temporary carrier plate with a plurality of at least three types of microgrooves. Each microgroove type has a tapered shape tailored to selectively accept micro LED devices that may emit at least red, green, and blue colors, and are designed to correspond to the different microgroove design. In one embodiment, the micro LEDs with a particular type (e.g., emitting a particular color) are dispersed in deionized water with a surfactant as a dispersing agent. The suspension of micro LEDs and surfactant is then sonicated in a container using an ultrasonic bath in order to prepare a homogeneous suspension. Surfactants may be used, examples of which are described above. The micro LED suspension is then deposited on the temporary carrier (having the plurality of types of microgrooves) as a film using a technique such as spin coating, electrophoretic deposition, or inkjet printing. In a particular embodiment, the micro LED type with the largest size, then medium size, then smallest size are dispersed in that order to ensure proper filling of the microgrooves with the correct micro LED devices. In another embodiment, the differential microgrooving and LED coupling is based on shape, such as square shapes versus hexagon shapes for iteritive exposures of microgroove and LED coupling.

Figure 17:
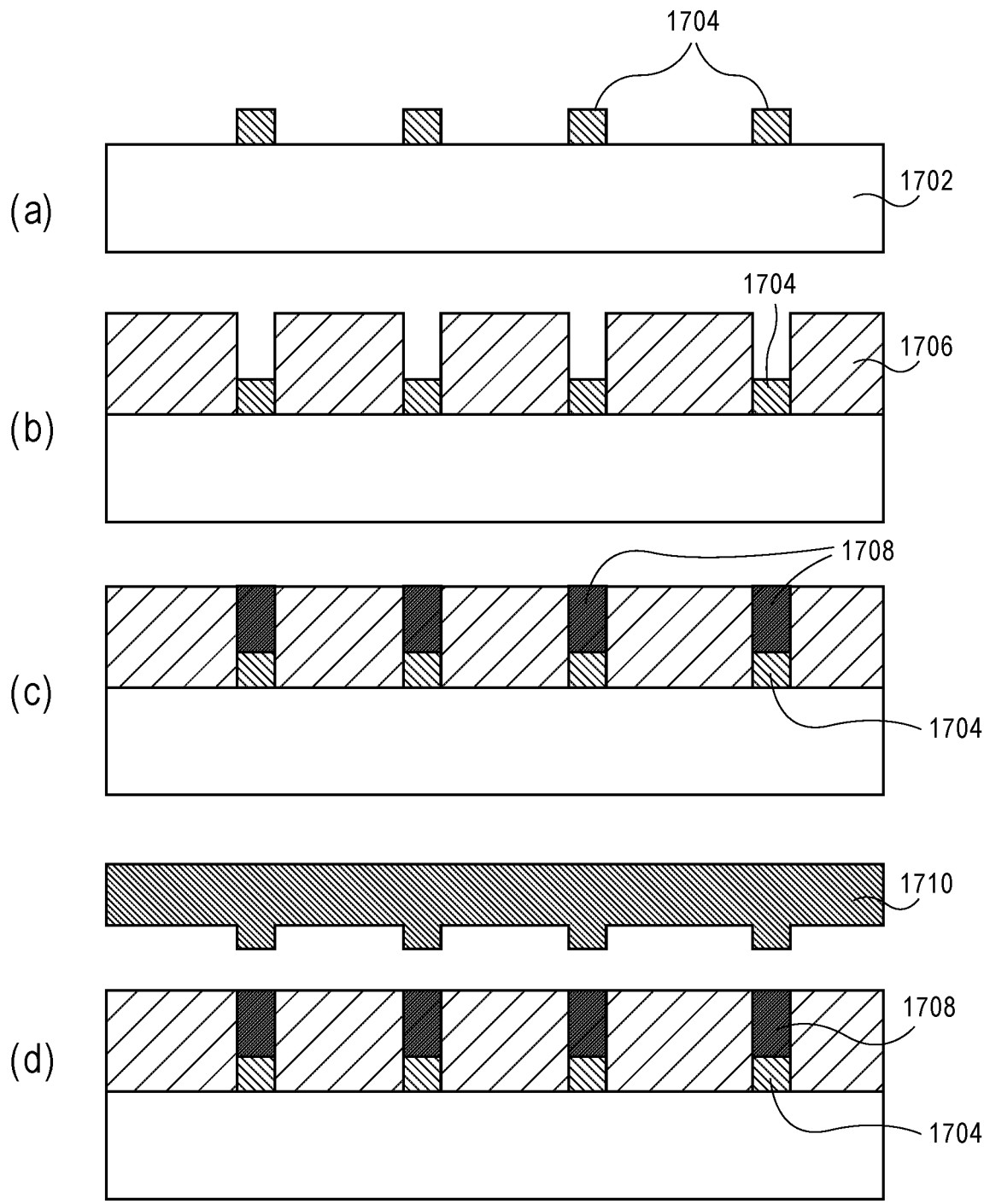
FIG. 17 illustrates cross-sectional views of various operations in an assembly approach involving electrophoresis, in accordance with an embodiment of the present disclosure.

FIG. 17 illustrates cross-sectional views of various operations in an assembly approach involving electrophoresis directly on a display back plane, in accordance with an embodiment of the present disclosure. Referring to part (a) of FIG. 17, a display backplane 1702 includes microbumps 1704 thereon. A mask 1706 is then formed around the microbumps 1702. A solution 1708 containing micro LEDs is then deposited on the structure of part (b) of FIG. 17.

Referring to part (c) of FIG. 17, a negative bias is applied to the display backplane and, in particular to the microbumps 1702. A current is passed through the solution and bulk fluid movement occurs at the chip surface and moves LEDs 1708 to the microbumps 1702. Referring to part (d) of FIG. 17, a pressure plate 1710 may be used to ensure bonding, such as thermo-compression bonding, of the microbumps 1702 to the LEDs 1708.

In an embodiment, electrophoretic deposition involves use of micro LEDs wrapped with surfactants that acquire a negative charge in water and are attracted to the positive side of the electrode under a DC electric field. A micro LED suspension is deposited on conductive substrates. A temporary carrier plate can be made with microgrooves that have bottoms made of metallic layer. The micro LEDs only deposit on the conductive area. Typical deposition time is only a few seconds.

Figure 18:
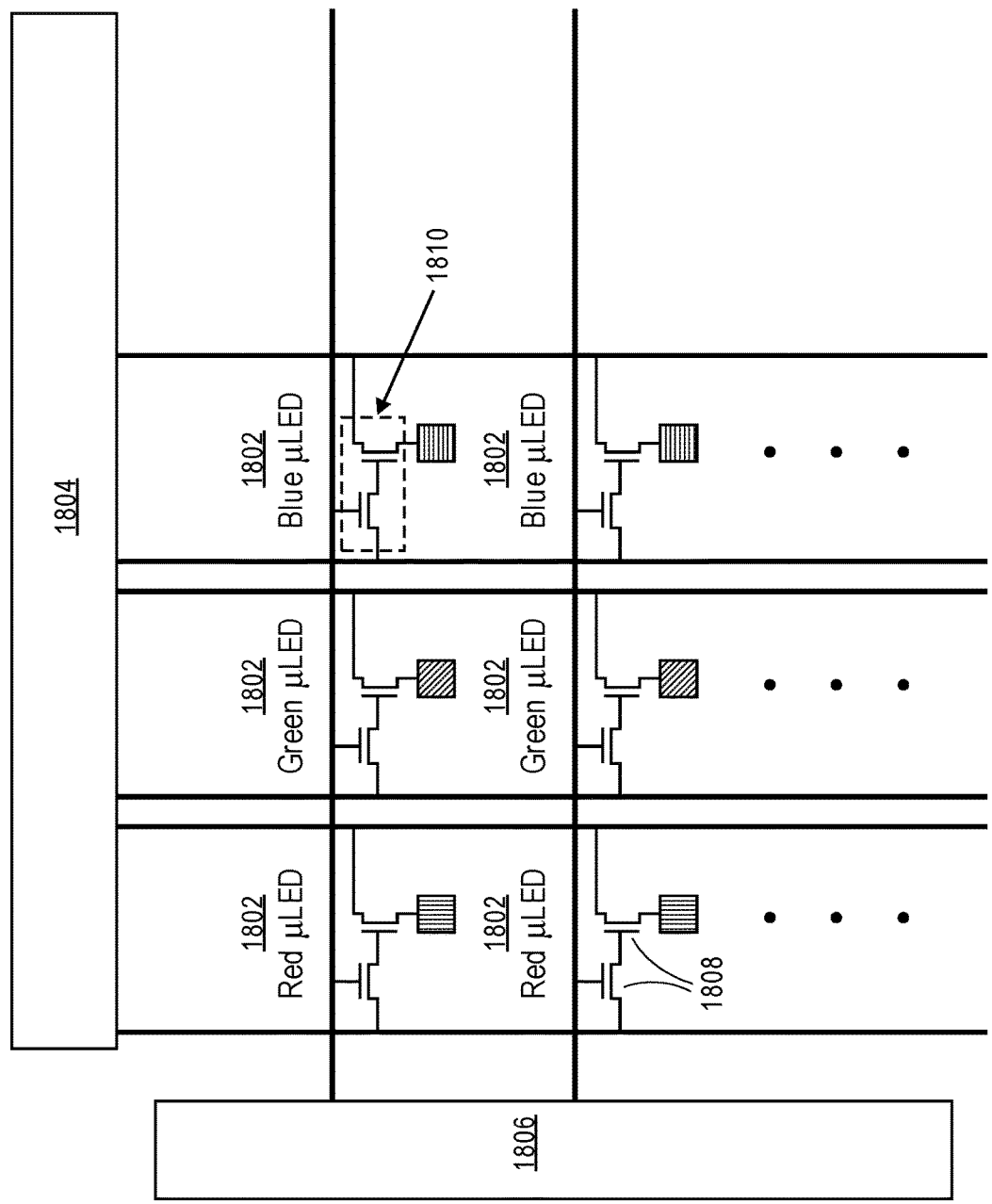
FIG. 18 is a schematic illustration of a display architecture, in accordance with an embodiment of the present disclosure.

FIG. 18 is a schematic illustration of a display architecture, in accordance with an embodiment of the present disclosure. Referring to FIG. 18, micro LEDs 1802 are arranged in a matrix. The micro LEDs are driven through "Data Driver" 1804 and "Scan Driver" 1806 chips. Thin film transistors 1808 are used to make "pixel driver circuits" 1810 for each micro LED. In an embodiment, the micro LEDs are fabricated on a silicon wafer then transferred to a glass substrate called "backplane" where the "pixel driver circuits" 1810 have been fabricated using thin film transistors.

Figure 19:
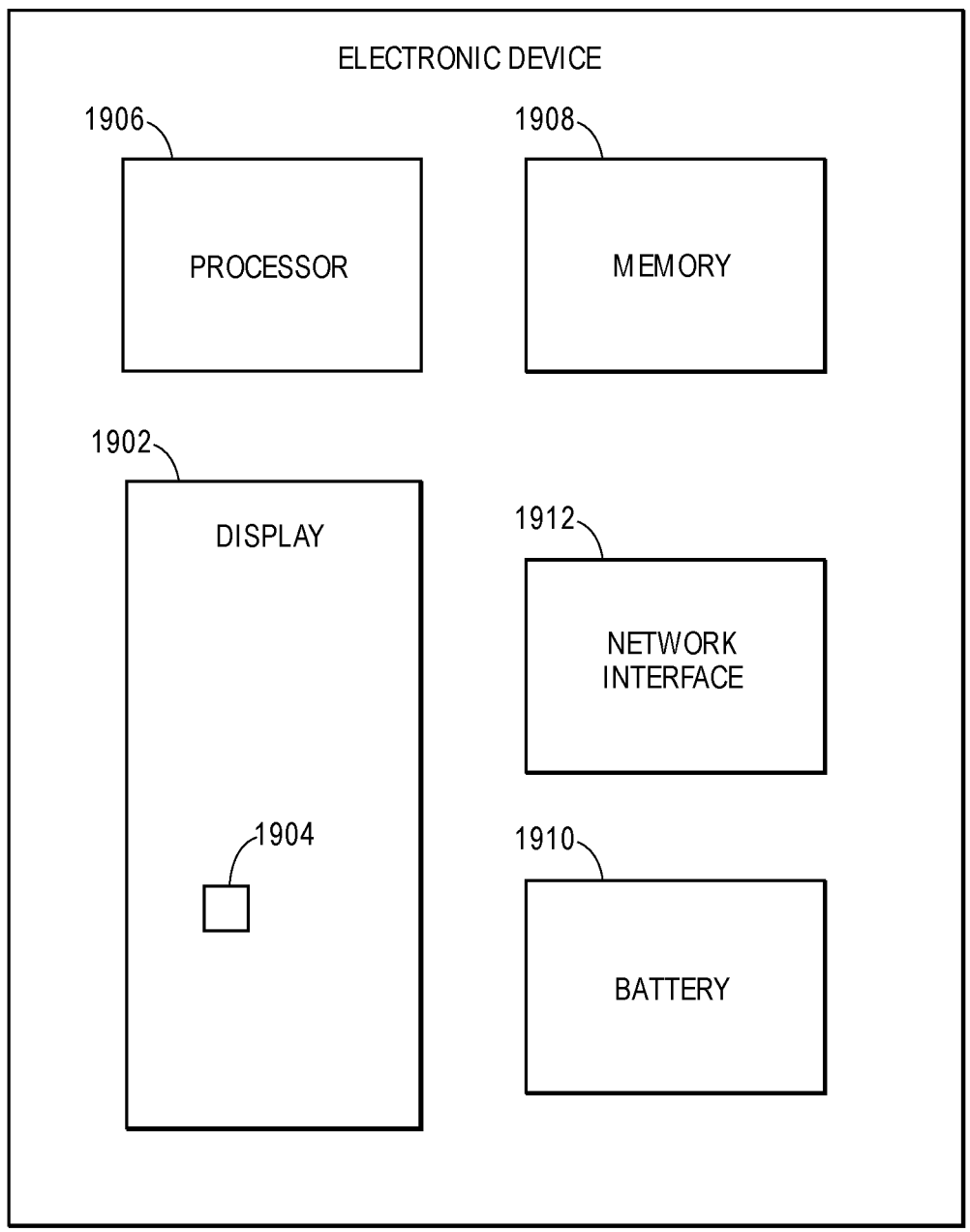
FIG. 19 is an electronic device having a display, in accordance with embodiments of the present disclosure.

FIG. 19 is an electronic device having a display, in accordance with embodiments of the present disclosure. Referring to FIG. 19, an electronic device 1900 has a display or display panel 1902 with a micro-structure 1904 (e.g., pixel element 508 of FIG. 5). The display may also have glass layers and other layers, circuitry, and so forth. The display panel 1902 may be a micro-LED display panel. As should be apparent, only one microstructure 1904 is depicted for clarity, though a display panel 1902 will have an array or arrays of microstructures including nanowire LEDs.

The electronic device 1900 may be a mobile device such as smartphone, tablet, notebook, smartwatch, and so forth. The electronic device 1900 may be a computing device, stand-alone display, television, display monitor, vehicle computer display, the like. Indeed, the electronic device 1900 may generally be any electronic device having a display or display panel.

The electronic device 1900 may include a processor 1906 (e.g., a central processing unit or CPU) and memory 1908. The memory 1908 may include volatile memory and non-volatile memory. The processor 1906 or other controller, along with executable code store in the memory 1908, may provide for touchscreen control of the display and well as for other features and actions of the electronic device 1900.

In addition, the electronic device 1900 may include a battery 1910 that powers the electronic device including the display panel 1902. The device 1900 may also include a network interface 1912 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 1900 may include additional components including circuitry and other components.

Thus, embodiments described herein include micro light-emitting diode (LED) displays and assembly apparatuses.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A method of manufacturing a micro-light emitting diode (LED) display panel includes positioning a carrier plate above a display backplane substrate, the carrier plate having a plurality of light-emitting diode (LED) pixel elements thereon, and the display backplane substrate having a plurality of metal bumps thereon. The method also includes moving the carrier plate toward the display backplane substrate to couple at least a portion of the plurality of LED pixel elements to corresponding ones of the plurality of metal bumps, applying pressure to the carrier plate to transfer and bond the portion of the plurality of LED pixel elements to the corresponding ones of the plurality of metal bumps, and, subsequently, separating the carrier plate from the display backplane substrate.

Example embodiment 2: The method of example embodiment 1, wherein the plurality of LED pixel elements has a pitch on the carrier substrate less than a pitch of the plurality of metal bumps on the display backplane substrate.

Example embodiment 3: The method of example embodiment 1 or 2, wherein the least the portion of the plurality of LED pixel elements is a less than all of the plurality of LED pixel elements, the method further including positioning the carrier plate above a second display backplane substrate, the carrier plate having a remainder of the plurality of light-emitting diode (LED) pixel elements thereon; and transferring and bonding at least a portion of the remainder of the plurality of LED pixel elements to corresponding ones of a plurality of metal bumps of the second display backplane substrate.

Example embodiment 4: The method of example embodiment 3, wherein the least the portion of the remainder of the plurality of LED pixel elements is a less than all of the remainder of the plurality of LED pixel elements, the method further including positioning the carrier plate above a third display backplane substrate, the carrier plate having a second remainder of the plurality of light-emitting diode (LED) pixel elements thereon; and transferring and bonding at least a portion of the second remainder of the plurality of LED pixel elements to corresponding ones of a plurality of metal bumps of the third display backplane substrate.

Example embodiment 5: The method of example embodiment 1, 2, 3 or 4, wherein the plurality of LED pixel elements is adhered to the carrier substrate using a pressure sensitive adhesive layer.

Example embodiment 6: The method of example embodiment 1, 2, 3, 4 or 5, wherein the plurality of LED pixel elements is a plurality of nanowire-based LED pixel elements.

Example embodiment 7: The method of example embodiment 6, wherein the plurality of nanowire-based LED pixel elements includes GaN nanowires.

Example embodiment 8: The method of example embodiment 6, wherein the plurality of nanowire-based LED pixel elements includes InGaN nanowires.

Example embodiment 9: A display bonder apparatus includes a first support for holding a display backplane substrate in a first position. A second support is for holding a carrier plate in a second position, the second position over the first position. A piston is coupled to the second support, the piston for moving the carrier plate from the second position toward the first position, and the piston for applying a force to the carrier plate to bond light-emitting diode (LED) pixel elements from the carrier plate to metal bumps on the display backplane substrate.

Example embodiment 10: The display bonder apparatus of example embodiment 9, wherein the piston is for providing a force sufficient to release the LED pixel elements from a pressure sensitive adhesive layer bonded to the carrier plate.

Example embodiment 11: A method of manufacturing a micro-light emitting diode (LED) display panel includes positioning a silicon substrate above a display backplane substrate, the silicon substrate having a plurality of light-emitting diode (LED) pixel elements thereon, and the display backplane substrate having a plurality of metal bumps thereon. The method also includes moving the display backplane substrate toward the silicon substrate to couple at least a portion of the plurality of LED pixel elements to corresponding ones of the plurality of metal bumps. The method also includes applying pressure to the display backplane substrate to transfer and bond the portion of the plurality of LED pixel elements to the corresponding ones of the plurality of metal bumps. The method also includes, subsequently, separating the silicon substrate from the display backplane substrate.

Example embodiment 12: The method of example embodiment 11, wherein the plurality of LED pixel elements has a pitch on the silicon substrate less than a pitch of the plurality of metal bumps on the display backplane substrate.

Example embodiment 13: The method of example embodiment 11 or 12, wherein the least the portion of the plurality of LED pixel elements is a less than all of the plurality of LED pixel elements, the method further including positioning the silicon substrate above a second display backplane substrate, the silicon substrate having a remainder of the plurality of light-emitting diode (LED) pixel elements thereon; and transferring and bonding at least a portion of the remainder of the plurality of LED pixel elements to corresponding ones of a plurality of metal bumps of the second display backplane substrate.

Example embodiment 14: The method of example embodiment 13, wherein the least the portion of the remainder of the plurality of LED pixel elements is a less than all of the remainder of the plurality of LED pixel elements, the method further including positioning the silicon substrate above a third display backplane substrate, the silicon substrate having a second remainder of the plurality of light-emitting diode (LED) pixel elements thereon; and transferring and bonding at least a portion of the second remainder of the plurality of LED pixel elements to corresponding ones of a plurality of metal bumps of the third display backplane substrate.

Example embodiment 15: The method of example embodiment 11, 12, 13 or 14, wherein the plurality of LED pixel elements is grown on the silicon substrate.

Example embodiment 16: The method of example embodiment 11, 12, 13, 14 or 15, wherein the plurality of LED pixel elements is a plurality of nanowire-based LED pixel elements.

Example embodiment 17: The method of example embodiment 16, wherein the plurality of nanowire-based LED pixel elements includes GaN nanowires.

Example embodiment 18: The method of example embodiment 16, wherein the plurality of nanowire-based LED pixel elements includes InGaN nanowires.

Example embodiment 19: A display bonder apparatus includes a first support for holding a display backplane substrate in a first position. A second support is for holding a silicon wafer in a second position, the second position over the first position. A piston is coupled to the first support, the piston for moving the display backplane substrate from the first position toward the second position, and the piston for applying a force to the display backplane substrate to bond light-emitting diode (LED) pixel elements from the silicon wafer to metal bumps on the display backplane substrate.

Example embodiment 20: The display bonder apparatus of example embodiment 19, further including an infra-red irradiation source coupled to the second support.

Example embodiment 21: A method of manufacturing a micro-light emitting diode (LED) display panel includes positioning a display backplane substrate in a tank or container, the display backplane substrate having microgrooves therein. The method also includes adding a fluid to the tank or container, the fluid including a suspension of light-emitting diode (LED) pixel elements therein. The method also includes moving the fluid over the display backplane substrate. The method also includes assembling LED pixel elements from the fluid into corresponding ones of the microgrooves.

Example embodiment 22: The method of example embodiment 21, wherein adding the fluid includes adding a fluid having a surfactant.

Example embodiment 23: The method of example embodiment 21 or 22, wherein the microgrooves of the display backplane substrate include a metal layer therein.

Example embodiment 24: The method of example embodiment 21, 22 or 23, wherein the microgrooves of the display backplane substrate are trapezoidal, and the suspension of LED pixel elements is a suspension of trapezoidal LED pixel elements.

Example embodiment 25: The method of example embodiment 24, wherein the trapezoidal microgrooves have at least a first size and a second size, and wherein the suspension of trapezoidal LED pixel elements corresponds to the first size but not the second size.

Example embodiment 26: The method of example embodiment 21, 22, 23, 24 or 25, wherein the suspension of LED pixel elements is a suspension of nanowire-based LED pixel elements.

Example embodiment 27: The method of example embodiment 26, wherein the suspension of nanowire-based LED pixel elements includes GaN nanowires or InGaN nanowires.

Example embodiment 28: A method of manufacturing a micro-light emitting diode (LED) display panel includes positioning a carrier plate in a tank or container, the carrier plate having microgrooves therein, adding a fluid to the tank or container, the fluid including a suspension of light-emitting diode (LED) pixel elements therein, moving the fluid over the carrier plate, assembling LED pixel elements from the fluid into corresponding ones of the microgrooves, and transferring the assembled LED pixel elements from the carrier plate to a display backplane substrate.

Example embodiment 29: The method of example embodiment 28, wherein adding the fluid includes adding a fluid having a surfactant.

Example embodiment 30: The method of example embodiment 28 or 29, wherein the microgrooves of the carrier plate are trapezoidal, and the suspension of LED pixel elements is a suspension of trapezoidal LED pixel elements.

Example embodiment 31: The method of example embodiment 30, wherein the trapezoidal microgrooves have at least a first size and a second size, and wherein the suspension of trapezoidal LED pixel elements corresponds to the first size but not the second size.

Example embodiment 32: The method of example embodiment 28, 29, 30 or 31, wherein the suspension of LED pixel elements is a suspension of nanowire-based LED pixel elements.

Example embodiment 33: The method of example embodiment 32, wherein the suspension of nanowire-based LED pixel elements includes GaN nanowires or InGaN nanowires.

Example embodiment 34: A method of manufacturing a micro-light emitting diode (LED) display panel includes positioning a substrate in a tank or container, the substrate having microgrooves therein. The method also includes adding a fluid to the tank or container, the fluid including a suspension of light-emitting diode (LED) pixel elements therein. The method also includes applying an electric field to the substrate of the fluid. The method also includes assembling LED pixel elements from the fluid into corresponding ones of the microgrooves.

Example embodiment 35: The method of example embodiment 34, wherein the substrate is a carrier plate, and the method further includes transferring the assembled LED pixel elements from the carrier plate to a display backplane substrate.

Example embodiment 36: The method of example embodiment 34, wherein the substrate is a display backplane substrate.

Example embodiment 37: The method of example embodiment 34, 35 or 36, wherein adding the fluid includes adding a fluid having a surfactant.

Example embodiment 38: The method of example embodiment 34, 35, 36 or 37, wherein the suspension of LED pixel elements is a suspension of nanowire-based LED pixel elements.

Example embodiment 39: The method of example embodiment 38, wherein the suspension of nanowire-based LED pixel elements includes GaN nanowires.

Example embodiment 40: The method of example embodiment 38, wherein the suspension of nanowire-based LED pixel elements includes InGaN nanowires.

Example embodiment 41: A pixel element for a micro-light emitting diode (LED) display panel includes a first color nanowire LED, a second color nanowire LED, the second color different than the first color, and a pair of third color nanowire LEDs, the third color different than the first and second colors. A continuous insulating material layer ius laterally surrounding the first color nanowire LED, the second color nanowire LED, and the pair of third color nanowire LEDs.

Example embodiment 42: The pixel element of example embodiment 41, wherein the first color is red, the second color is green, and the third color is blue.

Example embodiment 43: The pixel element of example embodiment 41, wherein the first color is red, the second color is blue, and the third color is green.

Example embodiment 44: The pixel element of example embodiment 41, wherein the first color is blue, the second color is green, and the third color is red.

Example embodiment 45: The pixel element of example embodiment 41, 42, 43 or 44, wherein the first color nanowire LED, the second color nanowire LED, and the pair of third color nanowire LEDs have a 2×2 arrangement from a plan view perspective.

Example embodiment 46: The pixel element of example embodiment 41, 42, 43, 44 or 45, wherein the first color nanowire LED, the second color nanowire LED, and the pair of third color nanowire LEDs include gallium nitride (GaN) cores.

Example embodiment 47: The pixel element of example embodiment 41, 42, 43, 44, 45 or 46, wherein the first color nanowire LED, the second color nanowire LED, and the pair of third color nanowire LEDs include indium gallium nitride (InGaN) shells.

Example embodiment 48: The pixel element of example embodiment 41, 42, 43, 44, 45, 46 or 47, wherein the continuous insulating material layer includes silicon oxide or carbon-doped silicon dioxide.

Example embodiment 49: A red-emitting diode structure includes a GaN nanowire above a substrate, an InGaN shell layer on the GaN nanowire, and an InGaN active layer on the InGaN shell layer, wherein the InGaN active layer has a greater concentration of In than the InGaN shell layer.

Example embodiment 50: The method of example embodiment 49, wherein the InGaN shell layer is an $In_{0.2}Ga_{0.8}N$ material layer.

Example embodiment 51: The method of example embodiment 49 or 50, wherein the InGaN active layer is an $In_{0.4}Ga_{0.6}N$ material layer.

Example embodiment 52: The method of example embodiment 49, 50 or 51, further including a cladding layer on the InGaN active layer, the cladding layer including p-type GaN or p-type ZnO.

Example embodiment 53: The method of example embodiment 49, 50, 51 or 52, wherein the InGaN active layer emits a wavelength in the range of 610-630 nanometers.

Example embodiment 54: The method of example embodiment 49, 50, 51, 52 or 53, wherein the substrate is a silicon substrate or a sapphire substrate.

Example embodiment 55: A red-emitting diode structure includes an InGaN nanowire above a substrate, and an InGaN active layer on the InGaN nanowire, wherein the InGaN active layer has a greater concentration of In than the InGaN nanowire.

Example embodiment 56: The method of example embodiment 55, wherein the InGaN nanowire is an $In_{0.2}Ga_{0.8}N$ material nanowire.

Example embodiment 57: The method of example embodiment 55 or 56, wherein the InGaN active layer is an $In_{0.4}Ga_{0.6}N$ material layer.

Example embodiment 58: The method of example embodiment 55, 56 or 57, further including a cladding layer on the InGaN active layer, the cladding layer including p-type GaN or p-type ZnO.

Example embodiment 59: The method of example embodiment 55, 56, 57 or 58, wherein the InGaN active layer emits a wavelength in the range of 610-630 nanometers.

Example embodiment 60: The method of example embodiment 55, 56, 57, 58 or 59, wherein the substrate is a silicon substrate or a sapphire substrate.

What is claimed is:

1. A pixel element for a micro-light emitting diode (LED) display panel, the pixel element comprising:
    a first color nanowire LED having sidewalls and a tapered portion;
    a second color nanowire LED having sidewalls and a tapered portion, the second color different than the first color;
    a pair of third color nanowire LEDs each having sidewalls and a tapered portion, the third color different than the first and second colors;
    a continuous insulating material layer laterally surrounding the first color nanowire LED, the second color nanowire LED, and the pair of third color nanowire LEDs; and
    a contact metal over and along the sidewalls and the tapered portion of the first color nanowire LED, over and along the sidewalls and the tapered portion of the second color nanowire LED, and over and along the sidewalls and the tapered portion of each of the pair of third color nanowire LEDs, the contact metal having a top surface co-planar with a top surface of the insulating material layer, and the contact metal having a non-uniform thickness over the tapered portion of each of the first, second, and third color nanowire LEDs.

2. The pixel element of claim 1, wherein the first color is red, the second color is green, and the third color is blue.

3. The pixel element of claim 1, wherein the first color is red, the second color is blue, and the third color is green.

4. The pixel element of claim 1, wherein the first color is blue, the second color is green, and the third color is red.

5. The pixel element of claim 1, wherein the first color nanowire LED, the second color nanowire LED, and the pair of third color nanowire LEDs have a 2×2 arrangement from a plan view perspective.

6. The pixel element of claim 1, wherein the first color nanowire LED, the second color nanowire LED, and the pair of third color nanowire LEDs comprise gallium nitride (GaN) cores.

7. The pixel element of claim 6, wherein the first color nanowire LED, the second color nanowire LED, and the pair of third color nanowire LEDs comprise indium gallium nitride (InGaN) shells.

8. The pixel element of claim 1, wherein the continuous insulating material layer comprises silicon oxide or carbon-doped silicon dioxide.

* * * * *